United States Patent
Onaka

(10) Patent No.: US 9,634,390 B2
(45) Date of Patent: Apr. 25, 2017

(54) ANTENNA DEVICE

(71) Applicant: Murata Manufacturing Co., Ltd., Nagaokakyo-shi, Kyoto-fu (JP)

(72) Inventor: Kengo Onaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 71 days.

(21) Appl. No.: 14/887,411

(22) Filed: Oct. 20, 2015

(65) Prior Publication Data

US 2016/0043468 A1    Feb. 11, 2016

Related U.S. Application Data

(63) Continuation of application No. PCT/JP2014/055350, filed on Mar. 4, 2014.

(30) Foreign Application Priority Data

May 10, 2013  (JP) ................. 2013-100156

(51) Int. Cl.
   *H01Q 9/00*    (2006.01)
   *H01Q 5/328*   (2015.01)
   (Continued)

(52) U.S. Cl.
   CPC ............ *H01Q 5/328* (2015.01); *H01Q 1/243* (2013.01); *H01Q 5/335* (2015.01); *H01Q 5/371* (2015.01); *H03H 7/40* (2013.01)

(58) Field of Classification Search
   USPC .................. 343/750, 745, 749, 787
   See application file for complete search history.

(56) References Cited

U.S. PATENT DOCUMENTS

| 6,670,924 B1* | 12/2003 | Shoji ............... H01Q 1/242 343/702 |
| 2002/0044092 A1 | 4/2002 | Kushihi |

(Continued)

FOREIGN PATENT DOCUMENTS

| JP | 63-177622 A | 7/1988 |
| JP | 2002-076750 A | 3/2002 |

(Continued)

OTHER PUBLICATIONS

Official Communication issued in International Patent Application No. PCT/JP2014/055350, mailed on May 20, 2014.

*Primary Examiner* — Hoang Nguyen
*Assistant Examiner* — Hai Tran
(74) *Attorney, Agent, or Firm* — Keating & Bennett, LLP

(57) ABSTRACT

A variable resonant circuit is inserted between a feeding point of a radiating element and a ground conductor. When the variable resonant circuit is not inserted, an input impedance of the radiating element is lower than about 50Ω and capacitive in a first low frequency band, lower than about 50Ω and inductive in a second low frequency band, and close to about 50Ω in a high frequency band. When the variable resonant circuit exhibits a first resonance characteristic, the variable resonant circuit is inductive in the first low frequency band, and its impedance in the high frequency band is higher than that in the first low frequency band. When the variable resonant circuit exhibits a second resonance characteristic, the variable resonant circuit is capacitive in the second low frequency band, and its impedance in the high frequency band is higher than that in the second low frequency band.

19 Claims, 26 Drawing Sheets

(51) Int. Cl.
*H01Q 5/371* (2015.01)
*H03H 7/40* (2006.01)
*H01Q 1/24* (2006.01)
*H01Q 5/335* (2015.01)

(56) References Cited

U.S. PATENT DOCUMENTS

| | | | |
|---|---|---|---|
| 2003/0136519 A1 | 7/2003 | Sumida et al. | |
| 2004/0075614 A1* | 4/2004 | Dakeya | H01Q 21/30 343/745 |
| 2008/0238569 A1* | 10/2008 | Matsuo | H03H 7/40 333/32 |
| 2008/0258984 A1 | 10/2008 | Adachi et al. | |
| 2009/0273531 A1* | 11/2009 | Ishizuka | H01Q 1/243 343/750 |
| 2009/0278755 A1* | 11/2009 | Shoji | H01Q 1/24 343/745 |
| 2011/0159832 A1 | 6/2011 | Yamagajo et al. | |
| 2011/0183633 A1* | 7/2011 | Ohba | H01Q 1/243 455/77 |
| 2012/0056795 A1* | 3/2012 | Nagumo | H01P 5/02 343/787 |
| 2012/0127049 A1* | 5/2012 | Kato | H01P 1/20345 343/749 |
| 2012/0139814 A1* | 6/2012 | Ishizuka | H01P 1/20 343/860 |
| 2013/0187824 A1* | 7/2013 | Kato | H04B 1/0458 343/852 |

FOREIGN PATENT DOCUMENTS

| | | |
|---|---|---|
| JP | 2003-197398 A | 7/2003 |
| JP | 2006-345042 A | 12/2006 |
| JP | 2011-155626 A | 8/2011 |
| WO | 2010/113353 A1 | 10/2010 |
| WO | 2011/024280 A1 | 3/2011 |

* cited by examiner

Fig.7A
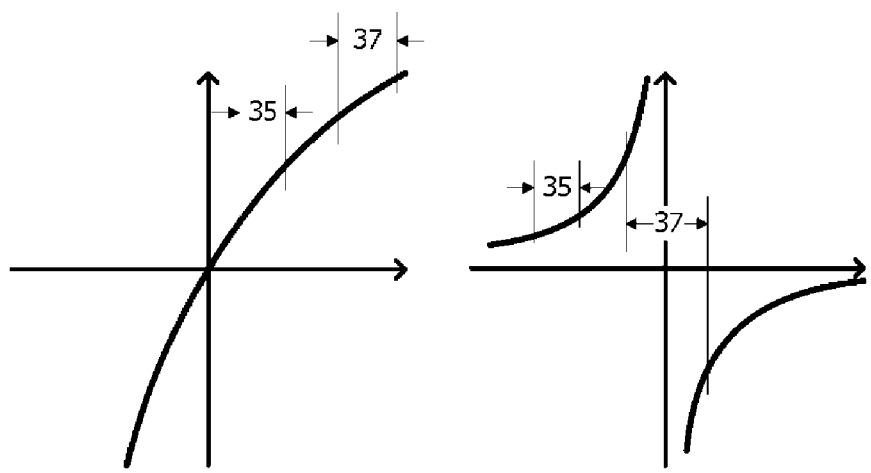
Fig.7B
Fig.7C
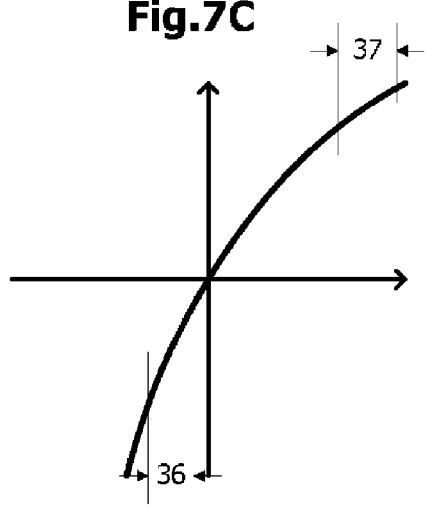
Fig.7D
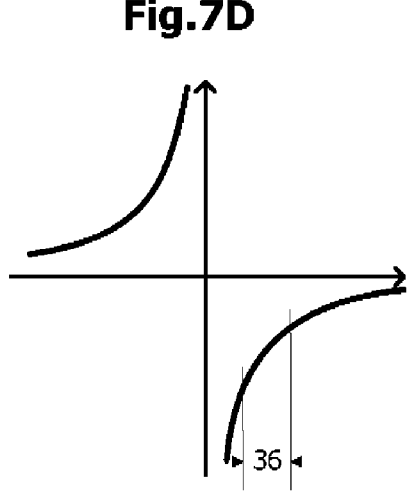

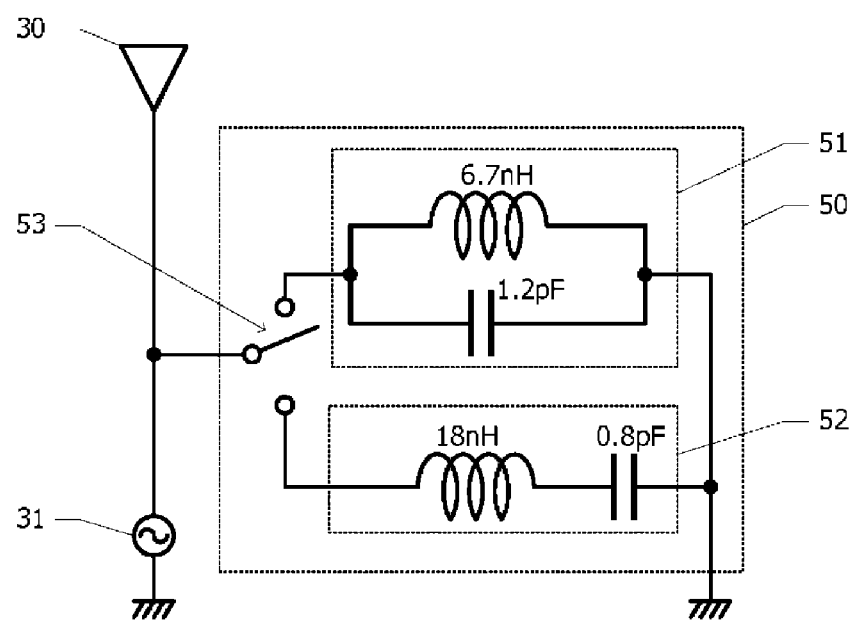

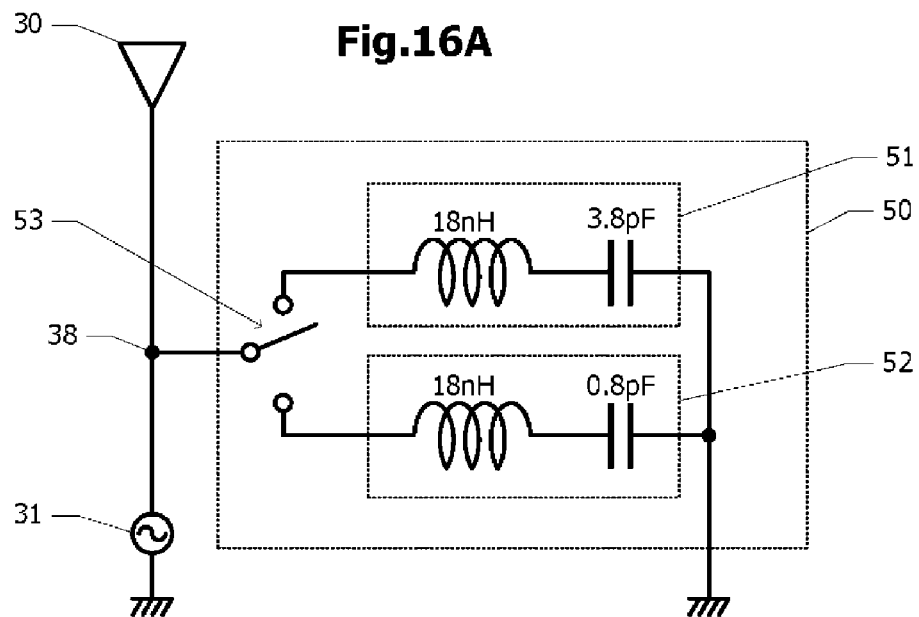
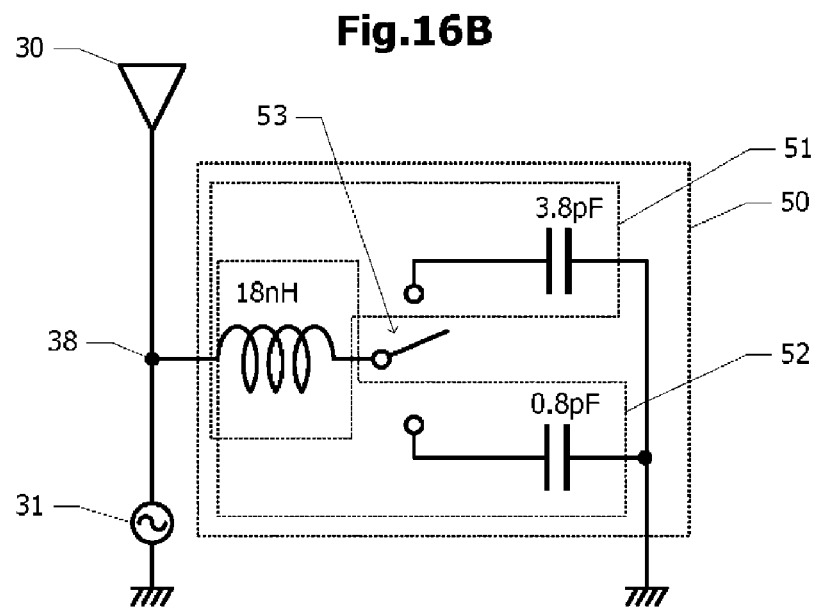

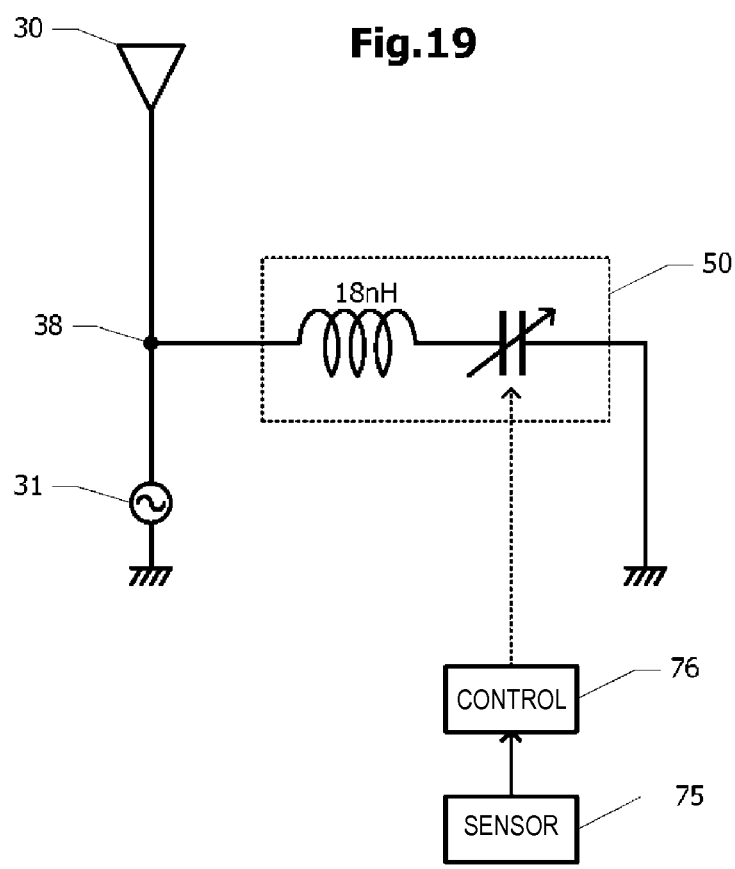

ANTENNA DEVICE

BACKGROUND OF THE INVENTION

1. Field of the Invention

The present invention relates to an antenna device that operates in at least two frequency bands on a low frequency side and a high frequency band higher than the frequency bands on the low frequency side.

2. Description of the Related Art

International Publication No. 2010/113353 discloses a multiband antenna device. The antenna device includes a reactance changing section and a matching section. The reactance changing section is connected in series to a radiating element, and the matching section is shunt-connected between a feeding circuit and the reactance changing section. The reactance changing section and the matching section are each defined by a parallel resonant circuit including an inductor and a capacitor.

The antenna device can support multiple bands by varying the resonance frequency of the reactance changing section. The matching section performs impedance matching.

By varying the resonance frequency of the reactance changing section, the radiating element can be operated in a band selected from multiple operating bands. In this case, in operating bands other than the selected one, a high return loss of the radiating element makes it difficult to perform efficient operation. For example, when it is desired to allow the radiating element to operate in both a band selected from multiple low frequency bands and a high frequency band, varying the resonance frequency of the reactance changing section to switch the low frequency band affects the high frequency band. This may lead to a loss of impedance matching in the high frequency band.

SUMMARY OF THE INVENTION

Preferred embodiments of the present invention provide an antenna device capable of continuing to operate in a high frequency band even in the case of switching a low frequency band.

An aspect of various preferred embodiments of the present invention provide an antenna device including a radiating element that operates in a first low frequency band, a second low frequency band higher than the first low frequency band, and a high frequency band higher than the second low frequency band; a ground conductor; and a variable resonant circuit inserted between a feeding point of the radiating element and the ground conductor, and that switches between at least two resonance characteristics, a first resonance characteristic and a second resonance characteristic. In an open state where the variable resonant circuit is not inserted between the feeding point and the ground conductor, an input impedance of the radiating element is lower than about 50Ω, for example, and capacitive in the first low frequency band, lower than about 50Ω, for example, and inductive in the second low frequency band, and closer to about 50Ω, for example, in the high frequency band than the input impedances in the first low frequency band and the second low frequency band are. When the variable resonant circuit exhibits the first resonance characteristic, the variable resonant circuit is inductive in the first low frequency band, and an impedance of the variable resonant circuit in the high frequency band is higher than an impedance of the variable resonant circuit in the first low frequency band. When the variable resonant circuit exhibits the second resonance characteristic, the variable resonant circuit is capacitive in the second low frequency band, and an impedance of the variable resonant circuit in the high frequency band is higher than an impedance of the variable resonant circuit in the second low frequency band.

When the variable resonant circuit exhibits the first resonance characteristic, impedance matching is improved in the first low frequency band. When the variable resonant circuit exhibits the second resonance characteristic, impedance matching is improved in the second low frequency band. In either state, an impedance matching state in the high frequency band is maintained.

In the first low frequency band, the input impedance of the radiating element obtained when the variable resonant circuit exhibits the first resonance characteristic is preferably closer to about 50Ω, for example, than the input impedance of the radiating element obtained in the open state is; and in the second low frequency band, the input impedance of the radiating element obtained when the variable resonant circuit exhibits the second resonance characteristic is preferably closer to about 50Ω, for example, than the input impedance of the radiating element obtained in the open state is.

Thus, sufficient impedance matching is achieved in the first low frequency band or the second low frequency band.

When the feeding point and the ground conductor are in the open state, a return loss of the radiating element in the high frequency band is preferably lower than return losses of the radiating element in the first low frequency band and the second low frequency band.

That is, in the high frequency band, impedance matching is preferably achieved without insertion of the variable resonant circuit.

For example, the first low frequency band ranges from about 704 MHz to about 784 MHz, the second low frequency band ranges from about 824 MHz to about 960 MHz, and the high frequency band ranges from about 1710 MHz to about 2170 MHz.

The variable resonant circuit may include a first resonant circuit exhibiting the first resonance characteristic, a second resonant circuit exhibiting the second resonance characteristic, and a switch that switches between a state where the first resonant circuit is inserted between the feeding point of the radiating element and the ground conductor and a state where the second resonant circuit is inserted between the feeding point of the radiating element and the ground conductor. One of the first resonant circuit and the second resonant circuit is defined by an LC series resonant circuit, and the other is defined by an LC series resonant circuit or an LC parallel resonant circuit.

The variable resonant circuit may include an inductor and a variable capacitor connected in series to each other, and may switch between the first resonance characteristic and the second resonance characteristic by varying a capacitance of the variable capacitor.

The antenna device may further include a sensor that detects an approach of an object that affects radiation characteristics of the radiating element, and a control circuit that varies the capacitance of the variable capacitor in accordance with a result of detection by the sensor.

The antenna device may further include a matching transformer inserted between the radiating element and the feeding point.

When the variable resonant circuit exhibits the first resonance characteristic, impedance matching is improved in the first low frequency band. When the variable resonant circuit exhibits the second resonance characteristic, impedance matching is improved in the second low frequency band. In either state, an impedance matching state in the high frequency band is maintained.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 7A to 7D are graphs showing examples of resonance characteristics of the variable resonant circuit.

FIG. 10 is an equivalent circuit diagram of an antenna device according to a second preferred embodiment of the present invention.

FIG. 16A is an equivalent circuit diagram of an antenna device according to a third preferred embodiment of the present invention, and FIG. 16B is an equivalent circuit diagram of an antenna device according to a modification of the third preferred embodiment of the present invention.

FIG. 19 is an equivalent circuit diagram of an antenna device according to a fourth preferred embodiment of the present invention.

DETAILED DESCRIPTION OF THE PREFERRED EMBODIMENTS

To evaluate how switching of a low frequency band affects a high frequency band in a multiband antenna device, various antenna devices were prepared to measure antenna characteristics. Before description of preferred embodiments of the present invention, a result of this evaluation experiment will be described.

Figure 1A:
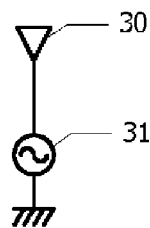
FIG. 1A is an equivalent circuit diagram of an antenna device to be evaluated.

FIG. 1A is an equivalent circuit diagram of an antenna device to be evaluated. High frequency power is supplied from a feeding circuit 31 to a radiating element 30. A branch monopole antenna was used as the radiating element 30. The branch monopole antenna is designed to achieve matching in a high frequency band without a matching circuit.

Figure 1B:
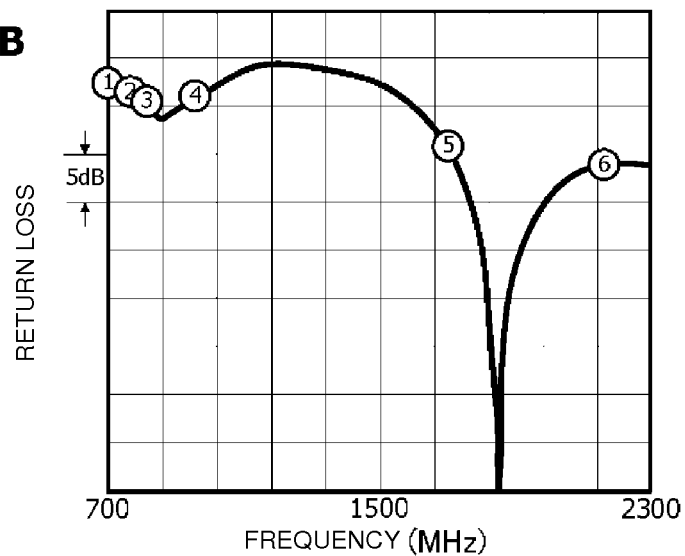
FIG. 1B is a graph showing a result of measurement of frequency characteristics of return loss of the antenna device illustrated in FIGS. 1A, and 1C is the corresponding admittance chart.

FIG. 1B shows a result of measurement of frequency characteristics of return loss of the radiating element 30. The horizontal axis represents frequency in "MHz", and the vertical axis represents return loss. One scale on the vertical axis is equivalent to 5 dB. Circled numbers in FIG. 1B each indicate either a lower limit frequency or an upper limit frequency of an operating frequency band. Point 1 and point 2 indicate frequencies of about 704 MHz and about 784 MHz, respectively, which correspond to a lower limit frequency and an upper limit frequency, respectively, of a band including band 17 and band 13. Point 3 and point 4 indicate frequencies of about 824 MHz and about 960 MHz, respectively, which correspond to a lower limit frequency and an upper limit frequency, respectively, of a band including band 5 and band 8. Point 5 and point 6 indicate frequencies of about 1710 MHz and about 2170 MH, respectively, which correspond to a lower limit frequency and an upper limit frequency, respectively, of a band including band 1 and band 3.

In the present description, the band ranging from about 704 MHz to about 784 MHz and including band 17 and band 13 will be referred to as "first low frequency band", the band ranging from about 824 MHz to about 960 MHz and including band 5 and band 8 will be referred to as "second low frequency band", and the band ranging from about 1710 MHz to about 2170 MHz and including band 1 and band 3 will be referred to as "high frequency band". A return loss is low and matching is achieved in the high frequency band.

Figure 1C:
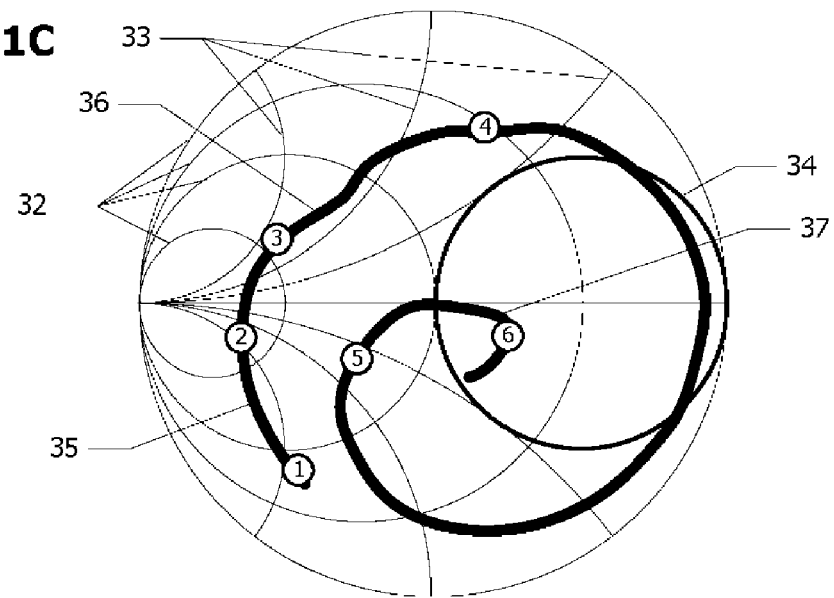

FIG. 1C shows a locus of input impedance of the radiating element 30 on an admittance chart. Constant conductance circles 32 and constant susceptance circles 33 are drawn. The upper half region of the admittance chart corresponds to inductive impedance, and the lower half of the admittance chart corresponds to capacitive impedance. A constant resistance circle 34 of about 50Ω, for example, is shown for reference purposes. The inside of the constant resistance circle 34 corresponds to input impedance higher than about 50Ω, for example, and the outside of the constant resistance circle 34 corresponds to input impedance lower than about 50Ω, for example.

Input impedance in a first low frequency band 35 is lower than about 50Ω, for example, and capacitive. Input impedance in a second low frequency band 36 is lower than about 50Ω, for example, and inductive. The locus of input impedance in a high frequency band 37 is located near the center of the admittance chart. That is, impedance matching is achieved in the high frequency band 37.

Figure 2A:
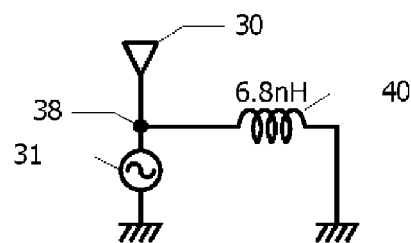
FIG. 2A is an equivalent circuit diagram of another antenna device to be evaluated.

In an antenna device illustrated in FIG. 2A, a shunt inductor 40 is connected between a feeding point 38 of the radiating element 30 and the ground. For example, the inductance of the shunt inductor 40 is preferably about 6.8 nH.

Figure 2B:
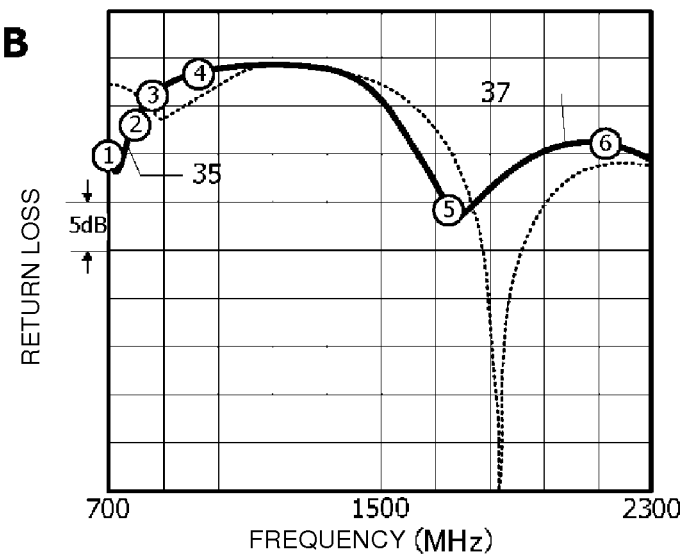
FIG. 2B is a graph showing a result of measurement of frequency characteristics of return loss of the antenna device illustrated in FIGS. 2A, and 2C is the corresponding admittance chart.
Figure 2C:
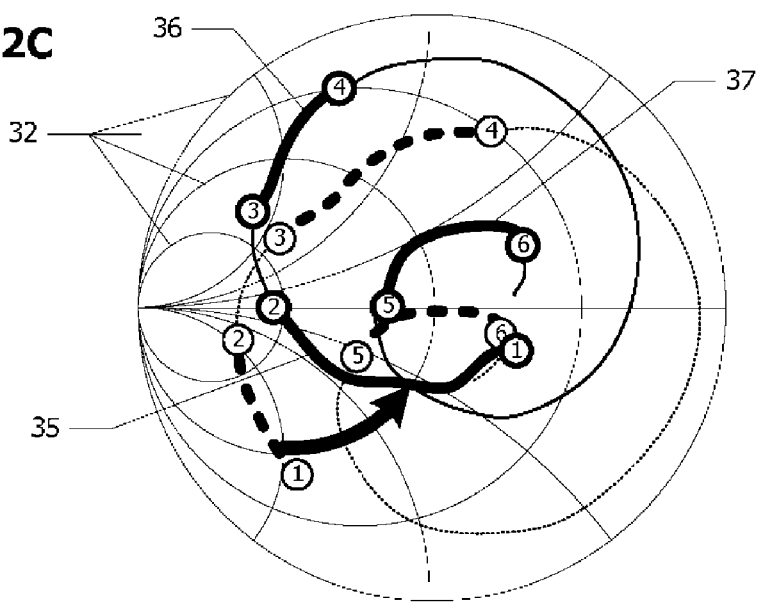

FIG. 2B shows a result of measurement of frequency characteristics of return loss of the radiating element 30 illustrated in FIG. 2A, and FIG. 2C shows a locus of input impedance of the radiating element 30 of FIG. 2A on an admittance chart. When the shunt inductor 40 is connected to the feeding point 38 of the radiating element 30, a point representing input impedance at each frequency moves in the direction of decreasing susceptance along the constant conductance circle 32 as indicated by an arrow. Therefore, the input impedance in the first low frequency band 35 approaches about 50Ω, for example (i.e., approaches the center of the admittance chart). Thus, as shown in FIG. 2B, a return loss in the first low frequency band 35 is lowered.

A return loss in the high frequency band 37 is higher than that obtained when the shunt inductor 40 is not connected, but is kept at a sufficiently low value. Therefore, even when the shunt inductor 40 is connected, the operation in the high frequency band 37 is possible. This is because the impedance of the shunt inductor 40 is sufficiently high in the high frequency band 37.

Figure 3A:
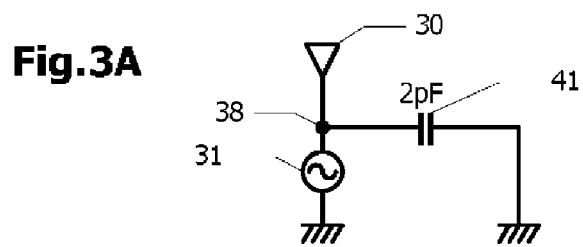
FIG. 3A is an equivalent circuit diagram of another antenna device to be evaluated.

In an antenna device illustrated in FIG. 3A, a shunt capacitor 41 is connected between the feeding point 38 of the radiating element 30 and the ground. For example, the capacitance of the shunt capacitor 41 preferably is about 2 pF.

Figure 3B:
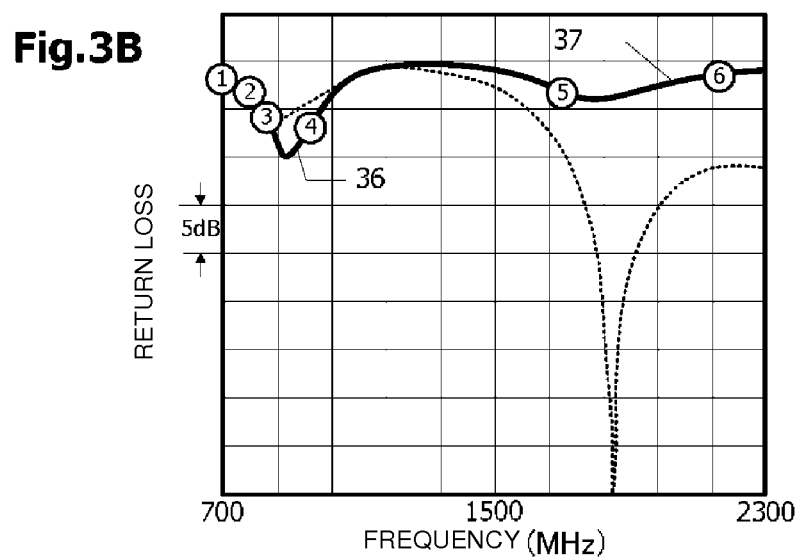
FIG. 3B is a graph showing a result of measurement of frequency characteristics of return loss of the antenna device illustrated in FIGS. 3A, and 3C is the corresponding admittance chart.
Figure 3C:
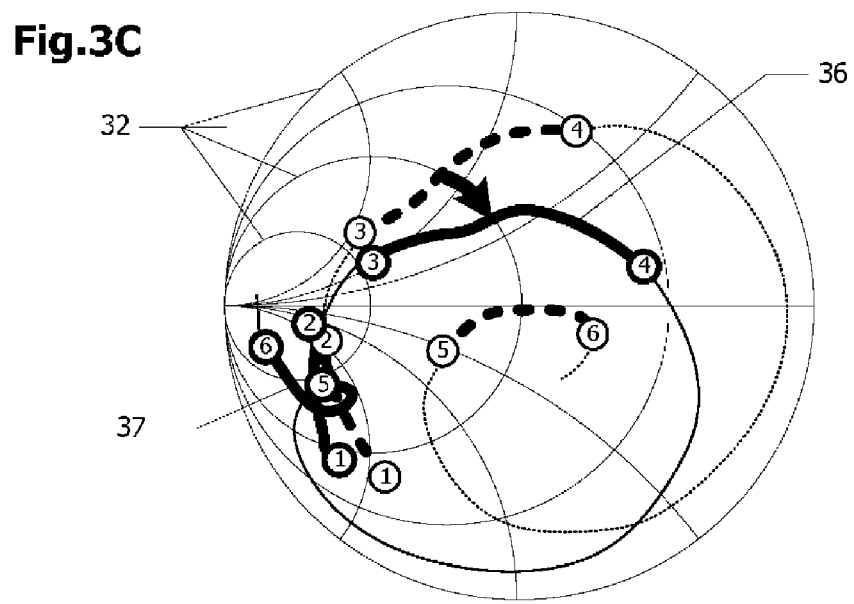

FIG. 3B shows a result of measurement of frequency characteristics of return loss of the radiating element 30 illustrated in FIG. 3A, and FIG. 3C shows a locus of input impedance of the radiating element 30 of FIG. 3A on an admittance chart. When the shunt capacitor 41 is connected to the feeding point 38 of the radiating element 30, a point representing input impedance at each frequency moves in the direction of increasing susceptance along the constant conductance circle 32 as indicated by an arrow. Therefore, the input impedance in the second low frequency band 36 approaches about 50Ω (i.e., approaches the center of the admittance chart). Thus, as shown in FIG. 3B, a return loss in the second low frequency band 36 is lowered.

In the high frequency band 37, the impedance of the shunt capacitor 41 approaches 0. That is, substantially the same state as that in which the feeding point 38 is grounded is reached. Therefore, in the high frequency band 37, the input impedance of the radiating element 30 is significantly lowered (i.e., each point representing the input impedance approaches the periphery of the admittance chart). Since impedance matching in the high frequency band 37 is lost, the return loss increases as shown in FIG. 3B.

The antenna device illustrated in FIGS. 2A to 2C is able to operate in both the first low frequency band 35 and the high frequency band 37. The antenna device illustrated in FIGS. 3A to 3C is able to operate in the second low frequency band 36, but has difficulty operating in the high frequency band 37.

Figure 4A:
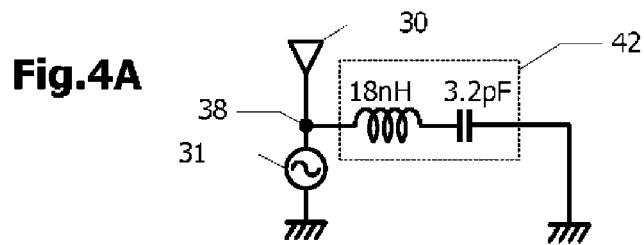
FIG. 4A is an equivalent circuit diagram of another antenna device to be evaluated.

In an antenna device illustrated in FIG. 4A, an LC series resonant circuit 42 is shunt-connected between the feeding point 38 of the radiating element 30 and the ground. For example, the inductance of the LC series resonant circuit 42 is 18 nH and the capacitance of the LC series resonant circuit 42 preferably is about 3.2 pF. The LC series resonant circuit 42 is equivalent to the approximately 6.8 nH inductance at about 740 MHz, which is the center frequency of the first low frequency band 35. That is, at about 740 MHz, the antenna device of FIG. 4A is equivalent to the antenna device of FIG. 2A. In a frequency band higher than about 740 MHz, the reactance of the LC series resonant circuit 42 is higher than that at about 740 MHz. In a frequency band higher than about 740 MHz, the reactance of the LC series resonant circuit 42 is higher than that at about 740 MHz.

Figure 4B:
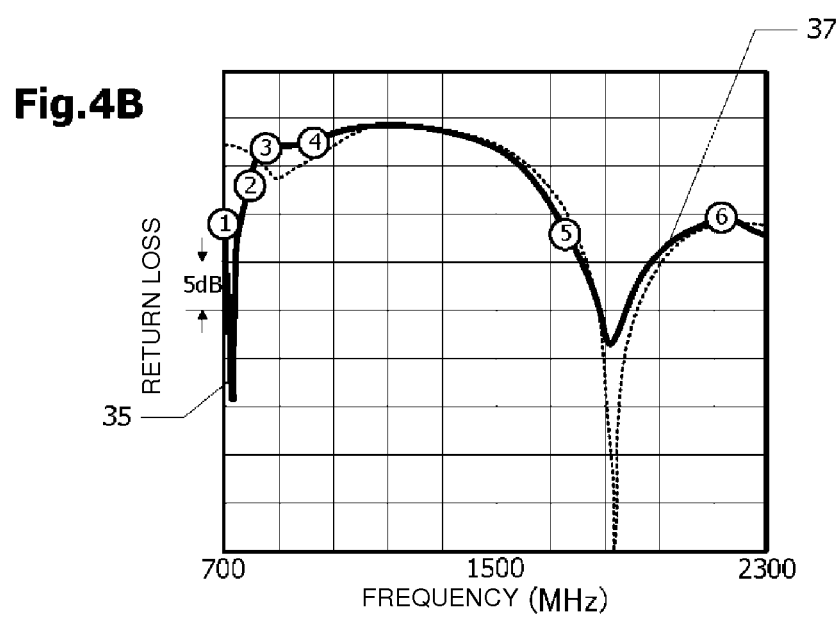
FIG. 4B is a graph showing a result of measurement of frequency characteristics of return loss of the antenna device illustrated in FIGS. 4A, and 4C is the corresponding admittance chart.
Figure 4C:
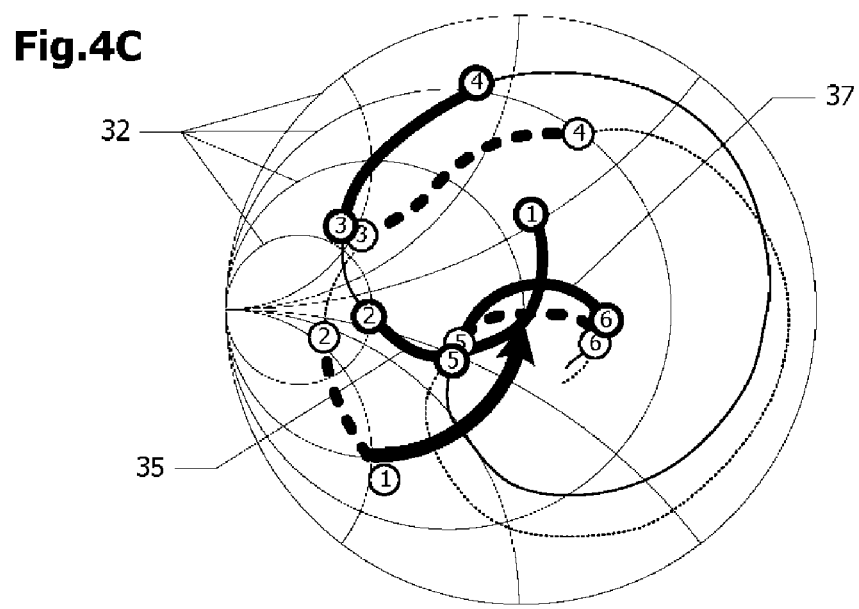

FIG. 4B shows a result of measurement of frequency characteristics of return loss of the radiating element 30 illustrated in FIG. 4A, and FIG. 4C shows a locus of input impedance of the radiating element 30 of FIG. 4A on an admittance chart. Since the LC series resonant circuit 42 shunt-connected to the feeding point 38 of the radiating element 30 exhibits an inductive impedance at frequencies higher than the first low frequency band 35, a point representing input impedance at each frequency moves in the direction of decreasing susceptance along the constant conductance circle 32 as indicated by an arrow. Therefore, the input impedance in the first low frequency band 35 approaches about 50Ω (i.e., approaches the center of the admittance chart). Thus, as shown in FIG. 4B, a return loss in the first low frequency band 35 is lowered.

In the high frequency band 37, the impedance of the LC series resonant circuit 42 is higher than that of the shunt inductor 40 illustrated in FIG. 2A. Therefore, the loss of impedance matching in the high frequency band 37 is less than that in the antenna device illustrated in FIG. 2A. Thus, a sufficiently low return loss is maintained in the high frequency band 37. By inserting the LC series resonant circuit 42 instead of the shunt inductor 40 (FIG. 2A) as described above, the degradation of antenna characteristics in the high frequency band 37 is significantly reduced or prevented.

Figure 5A:
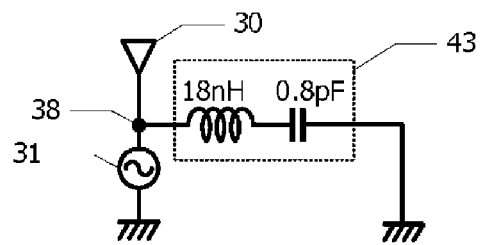
FIG. 5A is an equivalent circuit diagram of another antenna device to be evaluated.

In an antenna device illustrated in FIG. 5A, an LC series resonant circuit 43 is shunt-connected between the feeding point 38 of the radiating element 30 and the ground. For example, the inductance of the LC series resonant circuit 43 is about 18 nH and the capacitance of the LC series resonant circuit 43 is about 0.8 pF. The LC series resonant circuit 43 exhibits a capacitance of about 2 pF at about 880 MHz, which is the center frequency of the second low frequency band 36. That is, at about 880 MHz, the antenna device of FIG. 5A is equivalent to the antenna device of FIG. 3A. In a frequency range higher than about 1326 MHz, which is the resonance frequency of the LC series resonant circuit 43, the impedance of the LC series resonant circuit 43 is inductive.

Figure 5B:
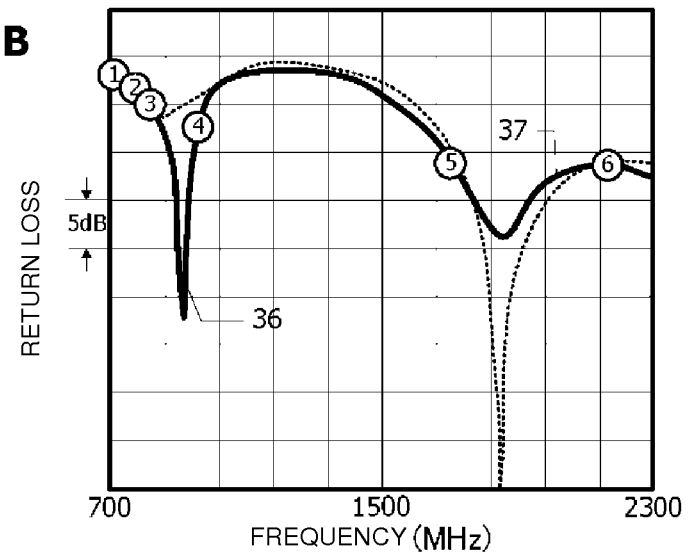
FIG. 5B is a graph showing a result of measurement of frequency characteristics of return loss of the antenna device illustrated in FIGS. 5A, and 5C is the corresponding admittance chart.
Figure 5C:
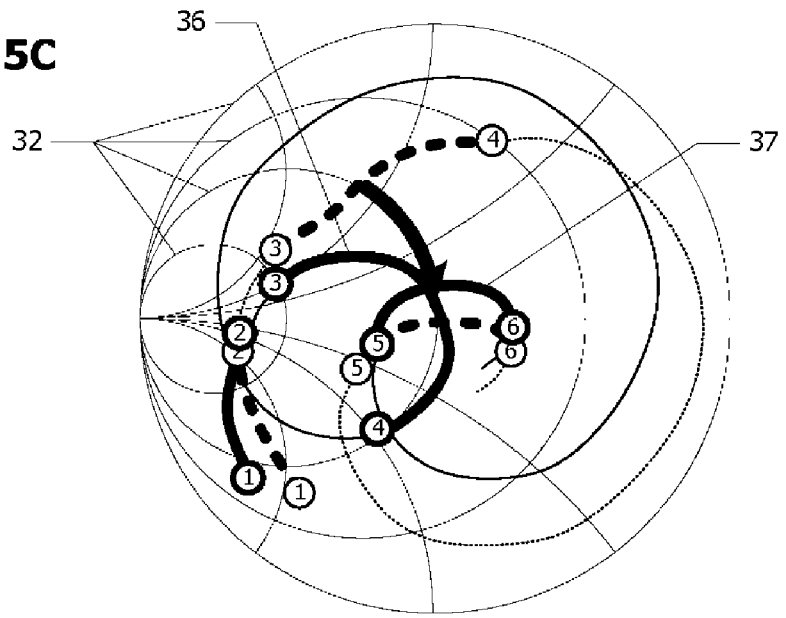

FIG. 5B shows a result of measurement of frequency characteristics of return loss of the radiating element 30 illustrated in FIG. 5A, and FIG. 5C shows a locus of input impedance of the radiating element 30 of FIG. 5A on an admittance chart. Since the LC series resonant circuit 43 shunt-connected to the feeding point 38 of the radiating element 30 exhibits a capacitive impedance in the second low frequency band 36, a point representing input impedance at each frequency moves in the direction of increasing susceptance along the constant conductance circle 32. Therefore, the input impedance in the second low frequency band 36 approaches about 50Ω (i.e., approaches the center of the admittance chart). Thus, as shown in FIG. 5B, a return loss in the second low frequency band 36 is lowered.

In the high frequency band 37, the impedance of the shunt capacitor 41 of the antenna device illustrated in FIG. 3A approaches 0. However, the LC series resonant circuit 43 of the antenna device illustrated in FIG. 5A exhibits an inductive impedance at frequencies higher than its resonance frequency, and the impedance increases as the frequency increases. Since the LC series resonant circuit 43 exhibits a sufficiently high impedance in the high frequency band 37, matching conditions in the high frequency band 37 are not significantly lost. Therefore, the antenna device illustrated in FIG. 5A is also able to operate in the high frequency band 37.

In the preferred embodiments described below, the operating frequency band of the antenna device is switched between the first low frequency band 35 and the second low frequency band 36. When the operating frequency band is switched to either of the first low frequency band 35 and the second low frequency band 36, the operation in the high frequency band is possible.

First Preferred Embodiment

Figure 6A:
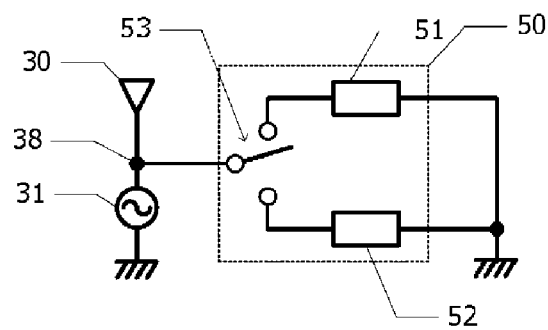
FIG. 6A is an equivalent circuit diagram of an antenna device according to a first preferred embodiment of the present invention.

FIG. 6A is an equivalent circuit diagram of an antenna device according to a first preferred embodiment of the present invention. The feeding circuit 31 supplies high frequency power to the feeding point 38 of the radiating element 30. The antenna device is designed to operate in a first low frequency band (e.g., ranging from about 704 MHz to about 784 MHz), a second low frequency band (ranging from about 824 MHz to about 960 MHz), and a high frequency band (ranging from about 1710 MHz to about 2170 MHz). A variable resonant circuit 50 is inserted (shunt-connected) between the feeding point 38 and the ground.

The variable resonant circuit 50 is able to switch the resonance characteristic between at least two resonance characteristics, a first resonance characteristic and a second resonance characteristic. For example, the variable resonant circuit 50 includes a first resonant circuit 51 exhibiting the first resonance characteristic, a second resonant circuit 52 exhibiting the second resonance characteristic, and a switch 53. For example, a single pole double throw switch (SPDT switch) is used as the switch 53. The switch 53 switches between a state in which the first resonant circuit 51 is inserted between the feeding point 38 and the ground and a state in which the second resonant circuit 52 is inserted between the feeding point 38 and the ground.

Figure 6B:
FIGS. 6B and 6C are equivalent circuit diagrams of an LC series resonant circuit and an LC parallel resonant circuit, respectively, applied to a variable resonant circuit.
Figure 6C:
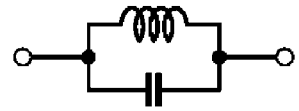

One of the first resonant circuit 51 and the second resonant circuit 52 is defined by an LC series resonant circuit illustrated in FIG. 6B, and the other is defined by an LC series resonant circuit illustrated in FIG. 6B or an LC parallel resonant circuit illustrated in FIG. 6C.

The input impedance of the radiating element 30 will be described with reference to a Smith chart (impedance chart) shown in FIG. 6D. In the open state where the variable resonant circuit 50 is not inserted between the feeding point 38 and the ground, the input impedance of the radiating element 30 is lower than about 50Ω, for example, and capacitive in the first low frequency band 35. That is, each point representing the input impedance of the radiating element 30 is located outside a constant resistance circle 56 of about 50Ω, for example, and in the lower half region of the Smith chart. For example, each point representing the input impedance of the radiating element 30 in the first low frequency band 35 is located in a region 57 illustrated in FIG. 6D.

In the open state where the variable resonant circuit 50 is not inserted between the feeding point 38 and the ground, the input impedance of the radiating element 30 is lower than about 50Ω, for example, and a capacitance in the second low frequency band 36. That is, each point representing the input impedance of the radiating element 30 is located outside the constant resistance circle 56 of about 50Ω, for example, and in the upper half region of the Smith chart. For example, each point representing the input impedance of the radiating element 30 in the second low frequency band 36 is located in a region 58 illustrated in FIG. 6D.

In the high frequency band 37, the input impedance of the radiating element 30 is closer to about 50Ω, for example, than the input impedances in the first low frequency band 35 and the second low frequency band 36 are. Specifically, each point representing the input impedance of the radiating element 30 in the high frequency band 37 is located in a region closer to a center 55 of the Smith chart than the regions 57 and 58 illustrated in FIG. 6D are. For example, each point representing the input impedance in the high frequency band 37 is located in a region 59 containing the center 55.

FIGS. 7A and 7B each show an example of the resonance characteristic of the first resonant circuit 51 (FIG. 6A). The horizontal axis represents frequency, the vertical axis represents reactance, and the origin corresponds to the resonance frequency. The resonance characteristic shown in FIG. 7A is realized by an LC series resonant circuit (FIG. 6B), and the resonance characteristic shown in FIG. 7B is realized by an LC parallel resonant circuit (FIG. 6C). The first resonant circuit 51 exhibits an inductive impedance in the first low frequency band 35, and exhibits a higher impedance in the high frequency band 37 than that in the first low frequency band 35.

Figure 6D:
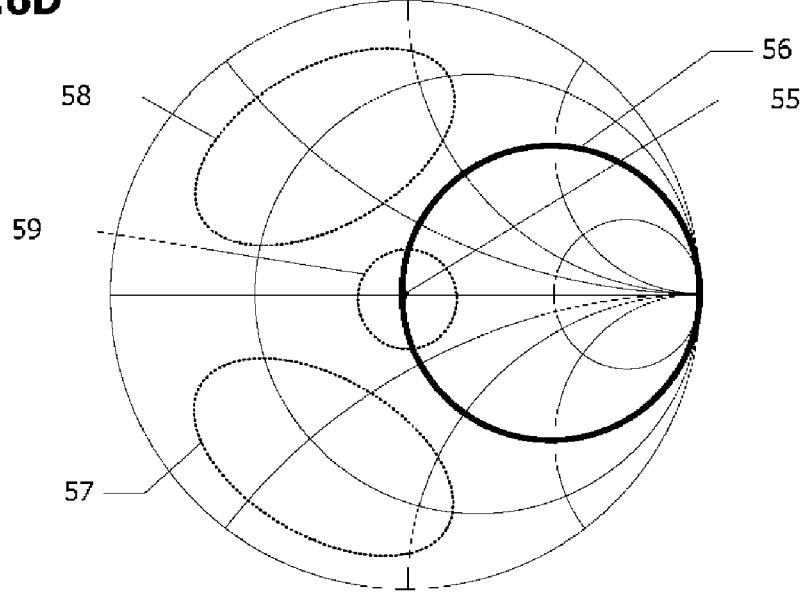
FIG. 6D is a Smith chart showing an input impedance of the antenna device according to the first preferred embodiment of the present invention.

When the first resonant circuit 51 exhibiting inductive properties in the first low frequency band 35 is shunt-connected to the feeding point 38, the input impedance of the radiating element 30 approaches the center 55 from the region 57 (FIG. 6D). Therefore, it is possible to improve impedance matching in the first low frequency band 35. Since the first resonant circuit 51 exhibits a high impedance in the high frequency band 37, the impedance matching state is maintained.

When the first resonant circuit 51 is defined by an LC series resonant circuit, the resonance frequency is lower than the first low frequency band 35 as shown in FIG. 7A. In this case, the impedance in the high frequency band 37 is always higher than that in the first low frequency band 35.

When the first resonant circuit 51 is defined by an LC parallel resonant circuit, the resonance frequency is higher than the first low frequency band 35 as shown in FIG. 7B. In a region where frequencies are higher than the resonance frequency, the impedance gradually approaches about 0Ω as the frequency increases. To make the impedance in the high frequency band 37 higher than that in the first low frequency band 35, the first resonant circuit 51 is designed such that the resonance frequency is located near the high frequency band 37 or inside the high frequency band 37.

FIG. 7C shows an example of the resonance characteristic of the second resonant circuit 52. The horizontal axis represents frequency, the vertical axis represents reactance, and the origin corresponds to the resonance frequency. The resonance characteristic shown in FIG. 7C is realized by an LC series resonant circuit (FIG. 6B). The second resonant circuit 52 exhibits a capacitive impedance in the second low frequency band 36, and exhibits a higher impedance in the high frequency band 37 than that in the second low frequency band 36.

When the second resonant circuit 52 exhibiting capacitive properties in the second low frequency band 36 is shunt-connected to the feeding point 38, the input impedance of the radiating element 30 approaches the center 55 from the region 58 (FIG. 6D). Therefore, it is possible to improve impedance matching in the second low frequency band 36. Since the second resonant circuit 52 exhibits a high impedance in the high frequency band 37, the impedance matching state is maintained.

FIG. 7D shows a resonance characteristic of an LC parallel resonant circuit. In order for the LC parallel resonant circuit to exhibit capacitive properties in the second low frequency band 36, the resonance frequency needs to be lower than the second low frequency band 36. In this case, in a frequency band higher than the second low frequency band 36, the impedance of the LC parallel resonant circuit is closer to about 0Ω than the impedance in the second low frequency band 36 is. It is thus not possible to meet a condition that an impedance higher than that in the second low frequency band 36 is exhibited in the high frequency band 37. Therefore, the second resonant circuit 52 cannot be defined by an LC parallel resonant circuit.

As described above, when the first resonant circuit 51 is selected by the switch 53, the antenna device is in an impedance-matched state in the first low frequency band 35 and the high frequency band 37. When the second resonant circuit 52 is selected by the switch 53, the antenna device is in an impedance-matched state in the second low frequency band 36 and the high frequency band 37.

Figure 8:
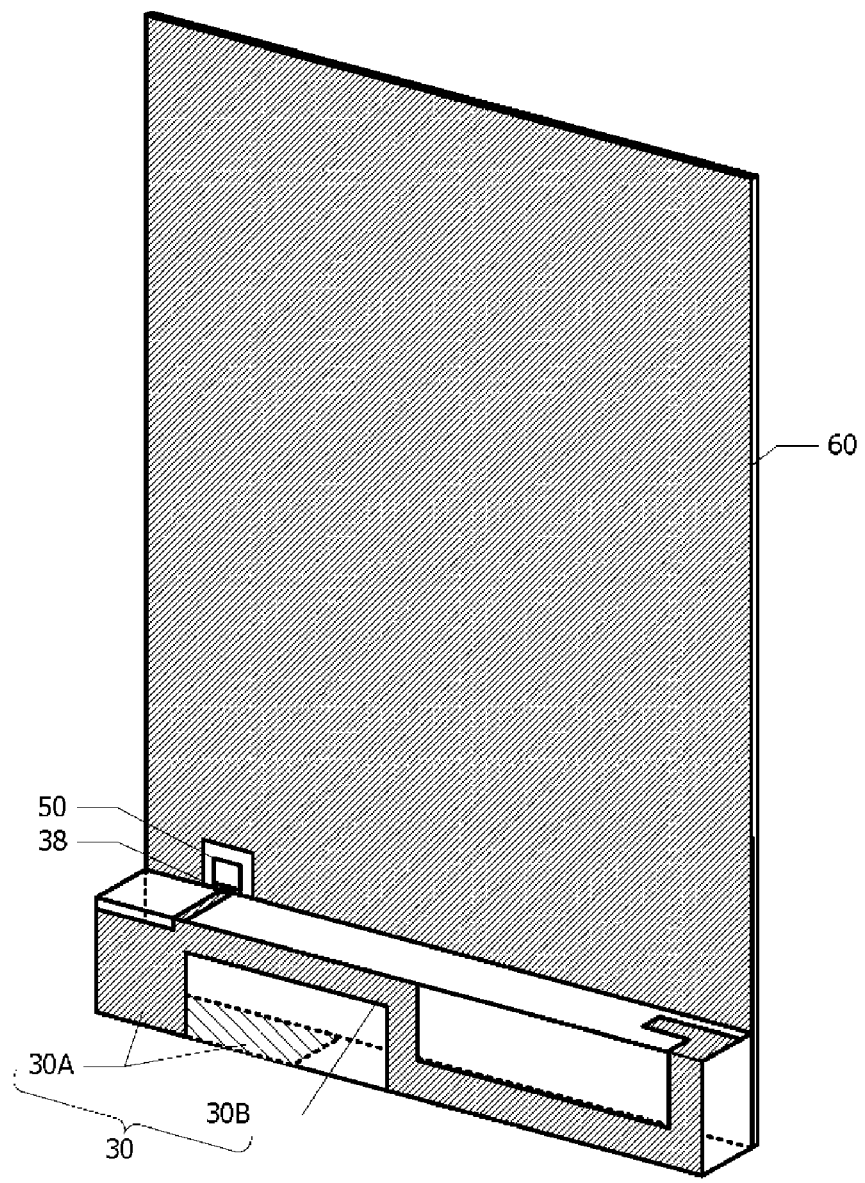
FIG. 8 is a perspective view of the antenna device according to the first preferred embodiment of the present invention.

FIG. 8 is a schematic perspective view of the antenna device according to the first preferred embodiment of the present invention. The antenna device is mounted, for example, on a mobile radio terminal. The radiating element 30 is disposed near an edge of a rectangular ground conductor 60. A dielectric substrate, such as a glass epoxy substrate, is preferably used as a substrate to define the ground conductor 60. Conductive films are provided on both sides of the dielectric substrate, and are connected to each other through a plurality of through-holes in the dielectric substrate. The conductive films define the ground conductor 60. For example, an ABS resin is used as a dielectric carrier to define the radiating element 30.

The radiating element 30 includes a high-frequency radiating element 30A and a low-frequency radiating element 30B. In the example illustrated in FIG. 8, the radiating element 30 has a branch monopole antenna structure. Instead of the branch monopole antenna, other antennas that operate in multiple bands (low and high frequency bands) may be used. For example, an antenna with a parasitic element can be used, which has single resonance in a low frequency band and double resonance in a high frequency band. The variable resonant circuit 50 is disposed near the feeding point 38 of the radiating element 30.

Ideally, the low-frequency radiating element 30B may be extended in a direction away from the ground conductor 60 such that its length is a quarter of the wavelength of the operating frequency. However, for example, because of demand for smaller mobile radio terminals, it is difficult to extend the low-frequency radiating element 30B in a direction away from the ground conductor 60. Therefore, the low-frequency radiating element 30B is often disposed along one edge of the ground conductor 60.

When the low-frequency radiating element 30B is disposed along one edge of the ground conductor 60, a stray capacitance between the low-frequency radiating element 30B and the ground conductor 60 increases. This lowers an input impedance in a low frequency band and makes it difficult to achieve impedance matching without a matching circuit. On the other hand, the high-frequency radiating element 30A, which is shorter than the low-frequency radiating element 30B, easily achieves impedance matching without a matching circuit.

In the first preferred embodiment, impedance matching is achieved in the first low frequency band or the second low frequency band by shunt-connecting the variable resonant circuit 50. In the high frequency band, impedance matching is achieved without a matching circuit. In particular, the shorter the distance from the ground conductor 60 to the farthest end of the low-frequency radiating element 30B as compared to the wavelength of the operating frequency, the more significant the effect achieved by adopting the configuration of the first preferred embodiment.

Figure 9:
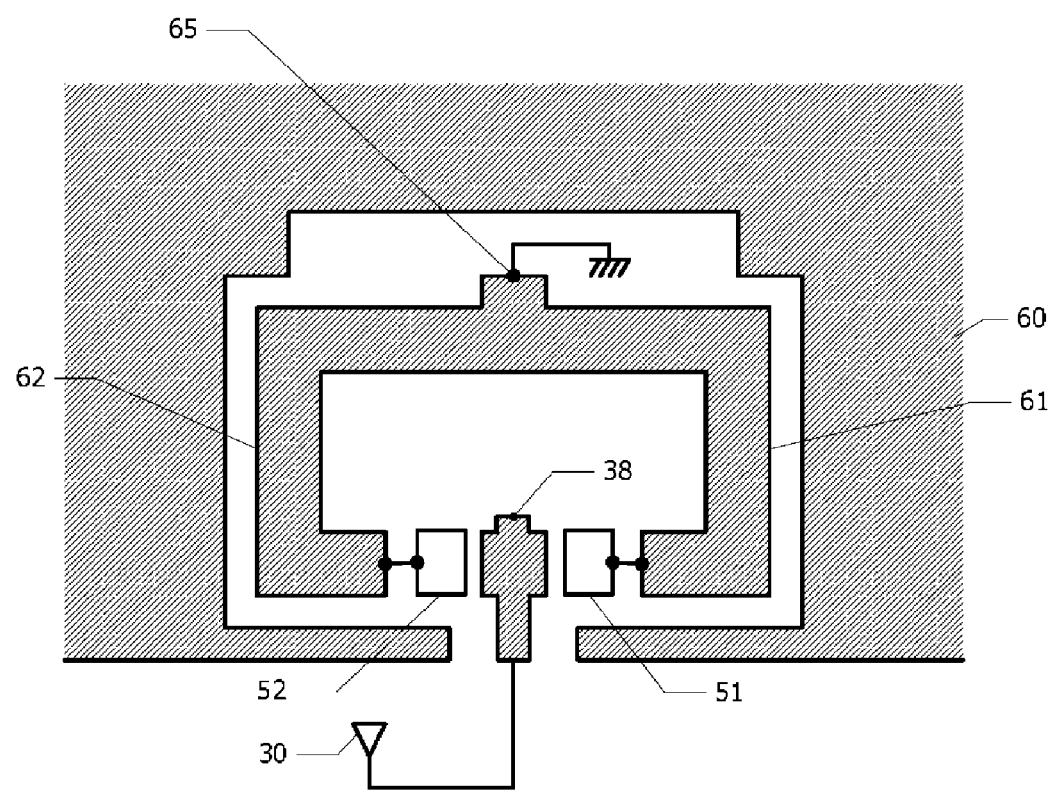
FIG. 9 is a plan view of the variable resonant circuit of the antenna device according to the first preferred embodiment of the present invention.

FIG. 9 is a plan view of the variable resonant circuit 50. The feeding point 38 of the radiating element 30 is connected by the switch 53 (FIG. 6A) to one of the first resonant circuit 51 and the second resonant circuit 52. A first transmission line 61 connects the first resonant circuit 51 to a ground point 65. A second transmission line 62 connects the second resonant circuit 52 to the ground point 65. The ground point 65 is connected through a through-hole in the dielectric substrate to the conductive film (ground conductor) on the back side.

When the first resonant circuit 51 is connected to the feeding point 38, the second transmission line 62 connected to the second resonant circuit 52 has the same structure as an open stub. Similarly, when the second resonant circuit 52 is connected to the feeding point 38, the first transmission line 61 connected to the first resonant circuit 51 has the same structure as an open stub. However, since these stub-structure patterns extend from the ground point 65, the antenna characteristics are less likely to be affected by unwanted resonance or the like caused by the stub-structure patterns.

The variable resonant circuit 50 is disposed between the ground and the vicinity of the feeding point 38 having a potential lower than that at a midpoint of the radiating element 30 in the longitudinal direction. Therefore, it is possible to prevent an excessively high voltage from being applied to the inductors, capacitors, and switch of the variable resonant circuit 50.

Second Preferred Embodiment

FIG. 10 is an equivalent circuit diagram of an antenna device according to a second preferred embodiment of the present invention. In the second preferred embodiment, the first resonant circuit 51 (FIG. 6A) of the first preferred embodiment is defined by a parallel resonant circuit including an approximately 6.7 nH inductor and an approximately 1.2 pF capacitor, and the second resonant circuit 52 (FIG. 6A) is defined by a series resonant circuit including an approximately 18 nH inductor and an approximately 0.8 pF capacitor.

Figure 11A:
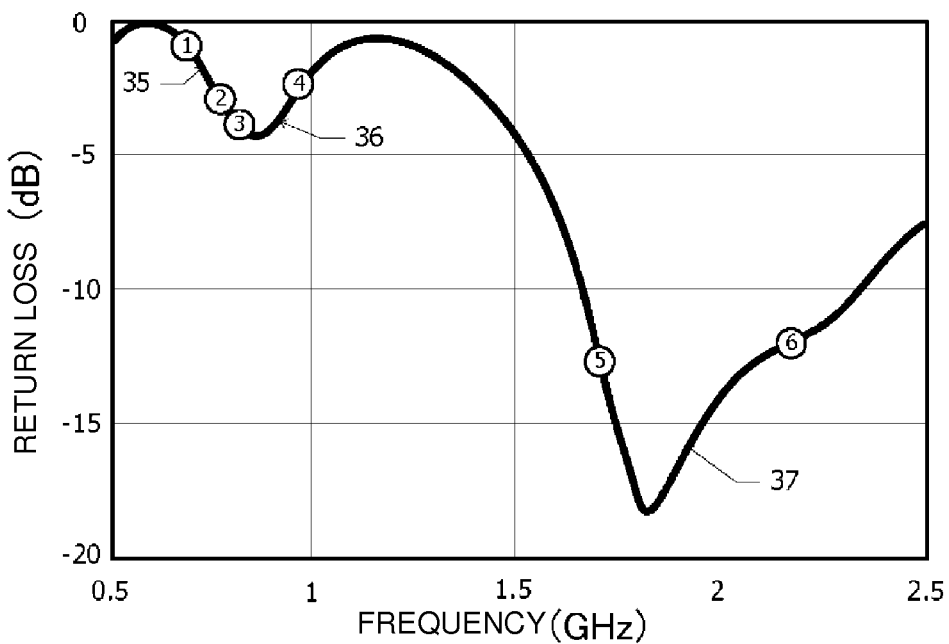
FIG. 11A is a graph showing a result of simulation of frequency characteristics of return loss obtained when the variable resonant circuit is not inserted.

FIG. 11A shows a result of simulation of frequency characteristics of return loss of the radiating element 30 in the open state where the variable resonant circuit 50 is not inserted between the feeding point 38 and the ground. A return loss is high in the first low frequency band 35 and the second low frequency band 36 because impedance matching is not achieved without insertion of the variable resonant circuit 50 (FIG. 10). A return loss is sufficiently low in the high frequency band 37 because impedance matching is achieved without insertion of the variable resonant circuit 50 (FIG. 10).

Figure 11B:
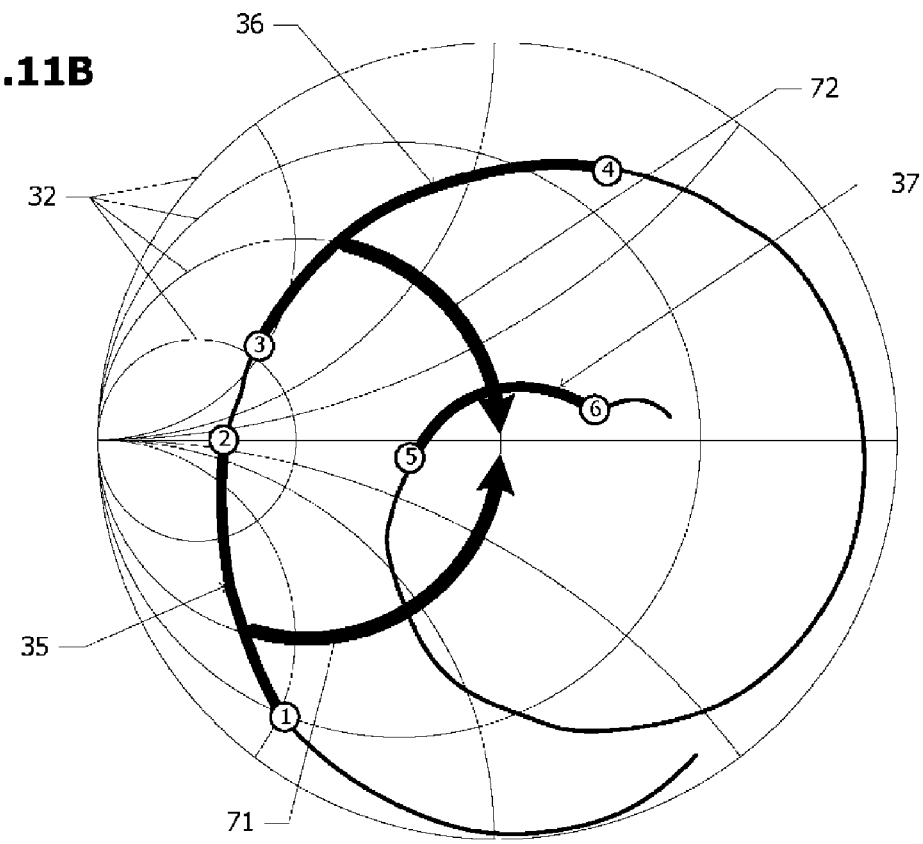
FIG. 11B is the corresponding admittance chart.

FIG. 11B shows a locus of input impedance of the radiating element 30 in the open state on an admittance chart. Point 1 and point 2 indicate a lower limit frequency and an upper limit frequency, respectively, of the first low frequency band 35. Point 3 and point 4 indicate a lower limit frequency and an upper limit frequency, respectively, of the second low frequency band 36. Point 5 and point 6 indicate a lower limit frequency and an upper limit frequency, respectively, of the high frequency band 37. In the first low frequency band 35, the input impedance of the radiating element 30 is higher than about 50Ω, for example, and capacitive. Hereinafter, the input impedance of the radiating element 30 will be simply referred to as "input impedance".

The input impedance in the second low frequency band 36 is lower than about 50Ω, for example, and inductive. The input impedance in the high frequency band 37 is closer to about 50Ω, for example, (i.e., the center of the admittance chart) than the input impedances in the first low frequency band 35 and the second low frequency band 36 are.

When a shunt inductor is inserted at the feeding point 38 (FIG. 10), a point corresponding to the input impedance moves on the admittance chart in the direction of decreasing susceptance along the constant conductance circle 32 as indicated by an arrow 71. Thus, the input impedance in the first low frequency band 35 is able to be brought closer to about 50Ω, for example.

When a shunt capacitor is inserted at the feeding point 38 (FIG. 10), a point corresponding to the input impedance moves on the admittance chart in the direction of increasing susceptance along the constant conductance circle 32 as indicated by an arrow 72. Thus, the input impedance in the second low frequency band 36 is able to be brought closer to about 50Ω.

Figure 12:
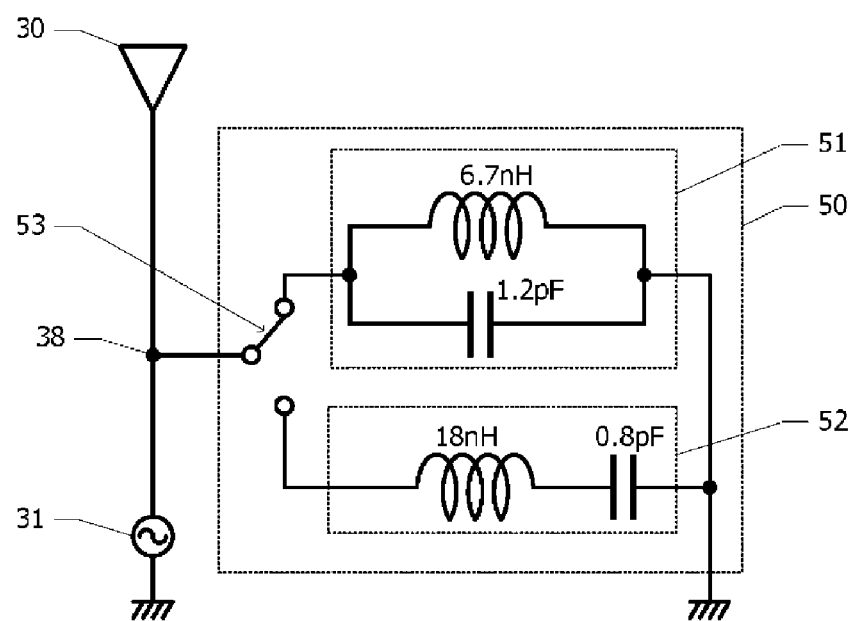
FIG. 12 is an equivalent circuit diagram of the antenna device according to the second preferred embodiment of the present invention in which a first resonant circuit is shunt-connected.
Figure 13A:
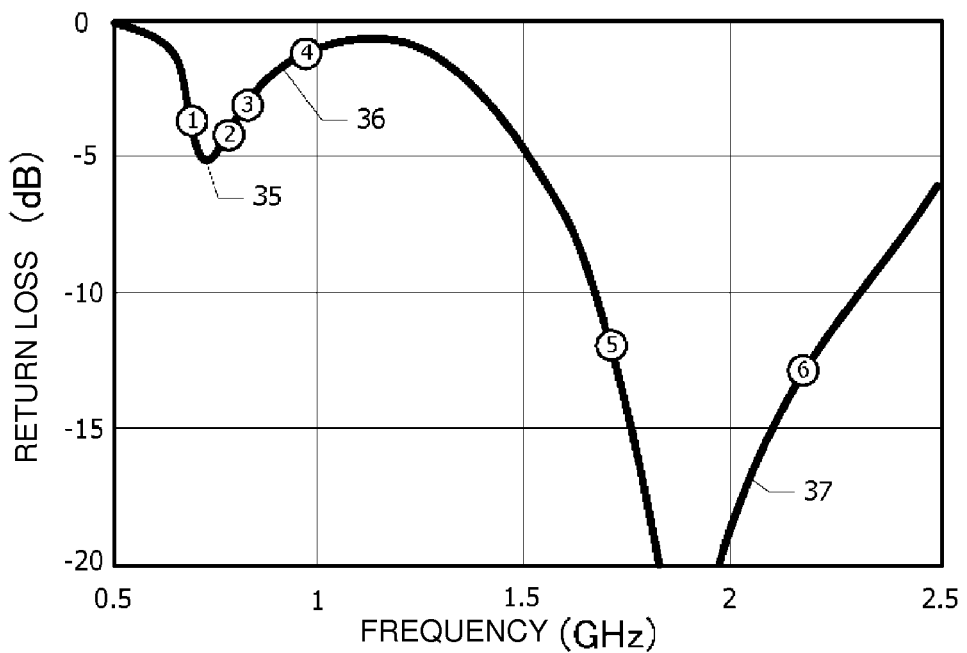
FIG. 13A is a graph showing a result of simulation of frequency characteristics of return loss obtained in the state of FIG. 12.
Figure 13B:
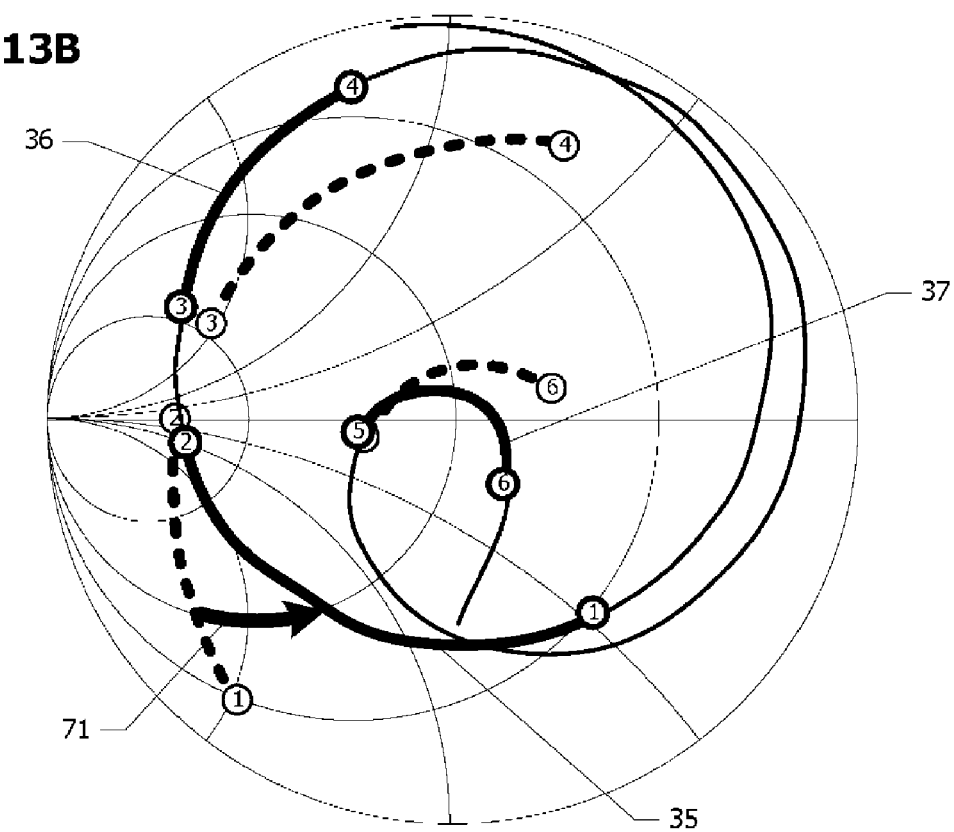
FIG. 13B is the corresponding admittance chart.

FIGS. 13A and 13B show a result of simulation of return loss and a locus of input impedance on an admittance chart, respectively, obtained when the first resonant circuit 51 is inserted between the feeding point 38 and the ground by the switch 53 as illustrated in FIG. 12. The first resonant circuit 51 exhibits an inductive impedance in the first low frequency band 35. Therefore, as shown in FIG. 13B, a point representing the input impedance in the first low frequency band 35 moves in the direction of the arrow 71. That is, the input impedance approaches about 50Ω, for example. Since impedance matching of the radiating element 30 is improved in the first low frequency band 35, a return loss in the first low frequency band 35 is lowered.

Even when the first resonant circuit 51 is shunt-connected, since the impedance of the first resonant circuit 51 is sufficiently high in the high frequency band 37, the impedance-matched state in the high frequency band is maintained.

Figure 14:
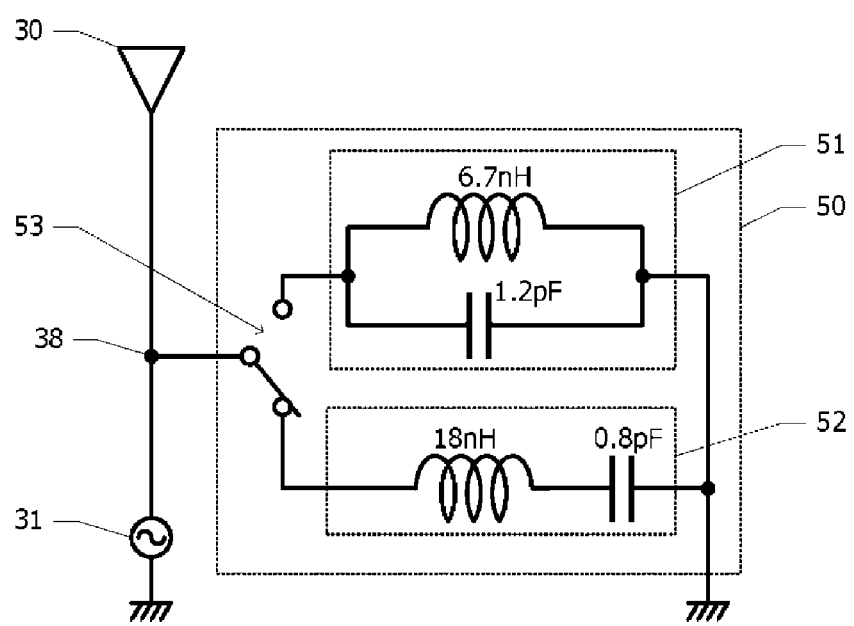
FIG. 14 is an equivalent circuit diagram of the antenna device according to the second preferred embodiment of the present invention in which a second resonant circuit is shunt-connected.
Figure 15A:
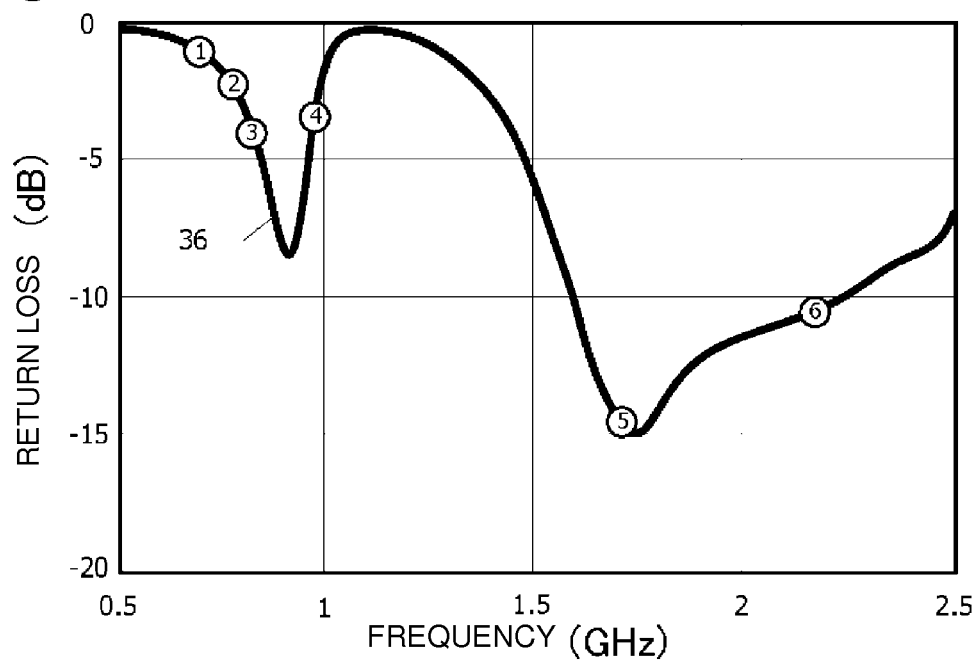
FIG. 15A is a graph showing a result of simulation of frequency characteristics of return loss obtained in the state of FIG. 14.
Figure 15B:
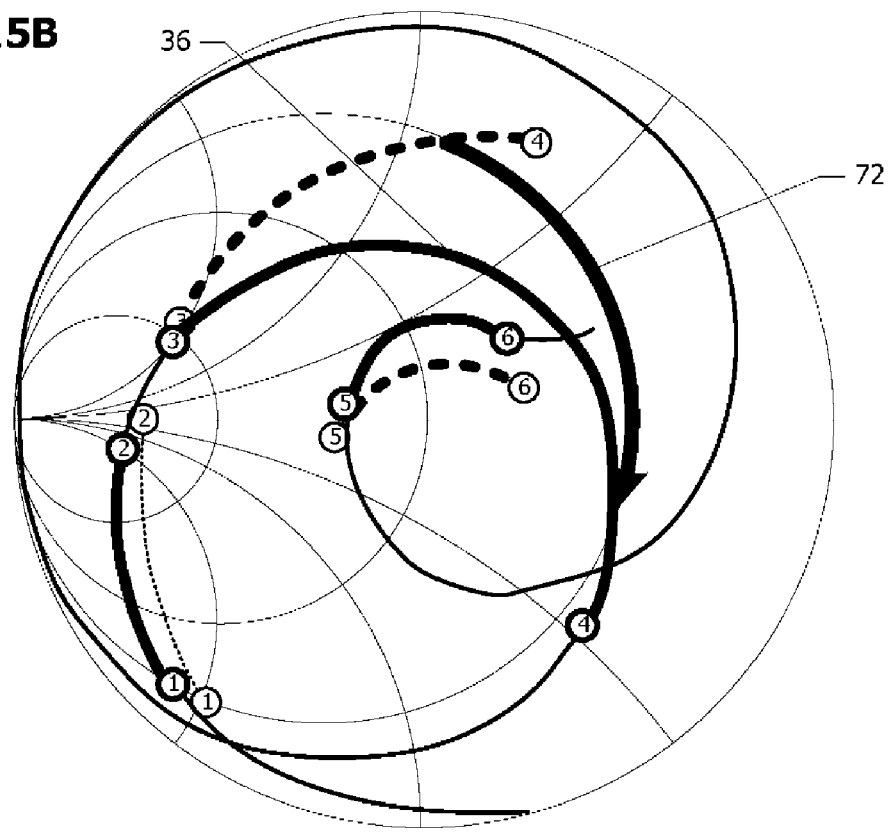
FIG. 15B is the corresponding admittance chart.

FIGS. 15A and 15B show a result of simulation of return loss and a locus of input impedance on an admittance chart, respectively, obtained when the second resonant circuit 52 is inserted between the feeding point 38 and the ground by the switch 53 as illustrated in FIG. 14. The second resonant circuit 52 exhibits a capacitive impedance in the second low frequency band 36. Therefore, as shown in FIG. 15B, a point representing the input impedance in the second low frequency band 36 moves in the direction of the arrow 72. That is, the input impedance approaches about 50Ω, for example. Since impedance matching of the radiating element 30 is improved in the second low frequency band 36, a return loss in the second low frequency band 36 is lowered.

Even when the second resonant circuit 52 is shunt-connected, since the impedance of the second resonant circuit 52 is sufficiently high in the high frequency band 37, the impedance-matched state in the high frequency band is maintained.

Third Preferred Embodiment

FIG. 16A is an equivalent circuit diagram of an antenna device according to a third preferred embodiment of the present invention. In the third preferred embodiment, the first resonant circuit 51 (FIG. 6A) of the first preferred embodiment is defined by a series resonant circuit including an approximately 18 nH inductor and an approximately 3.8 pF capacitor. Like the second resonant circuit 52 (FIG. 10) of the second preferred embodiment, the second resonant circuit 52 (FIG. 6A) is defined by a series resonant circuit including an approximately 18 nH inductor and an approximately 0.8 pF capacitor. Although one of the first resonant circuit 51 and the second resonant circuit 52 is defined by an LC series resonant circuit and the other is defined by an LC parallel resonant circuit in the second preferred embodiment, the first resonant circuit 51 and the second resonant circuit 52 are each defined by an LC series resonant circuit in the third preferred embodiment.

As illustrated in FIG. 16B, the approximately 18 nH inductor may be shared between the first resonant circuit 51 and the second resonant circuit 52, and the approximately 0.8 pF capacitor and the approximately 3.8 pF capacitor may be switched from one to the other.

Figure 17:
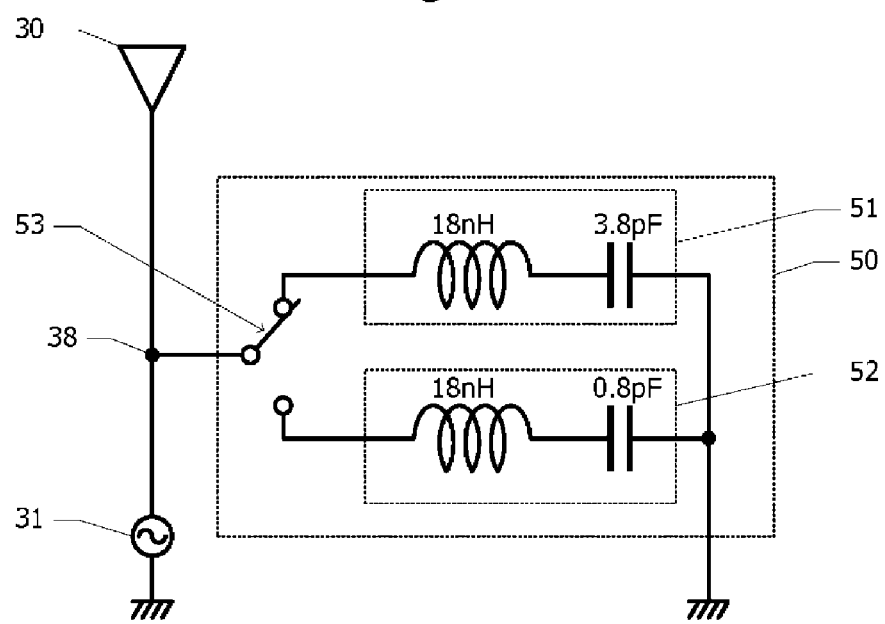
FIG. 17 is an equivalent circuit diagram of the antenna device according to the third preferred embodiment of the present invention in which the first resonant circuit is shunt-connected.
Figure 18A:
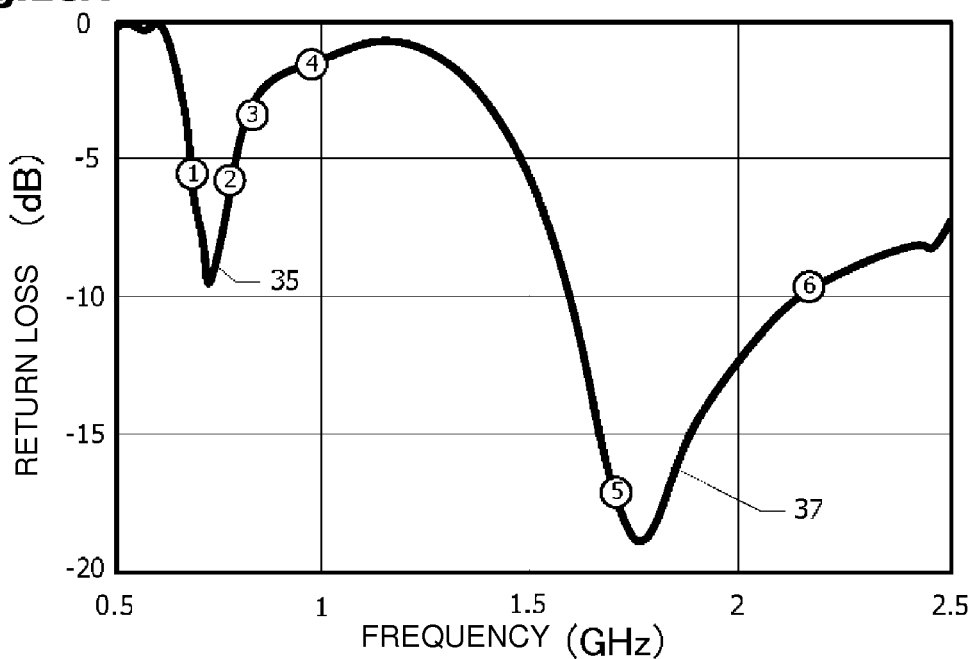
FIG. 18A is a graph showing a result of simulation of frequency characteristics of return loss obtained in the state of FIG. 17.
Figure 18B:
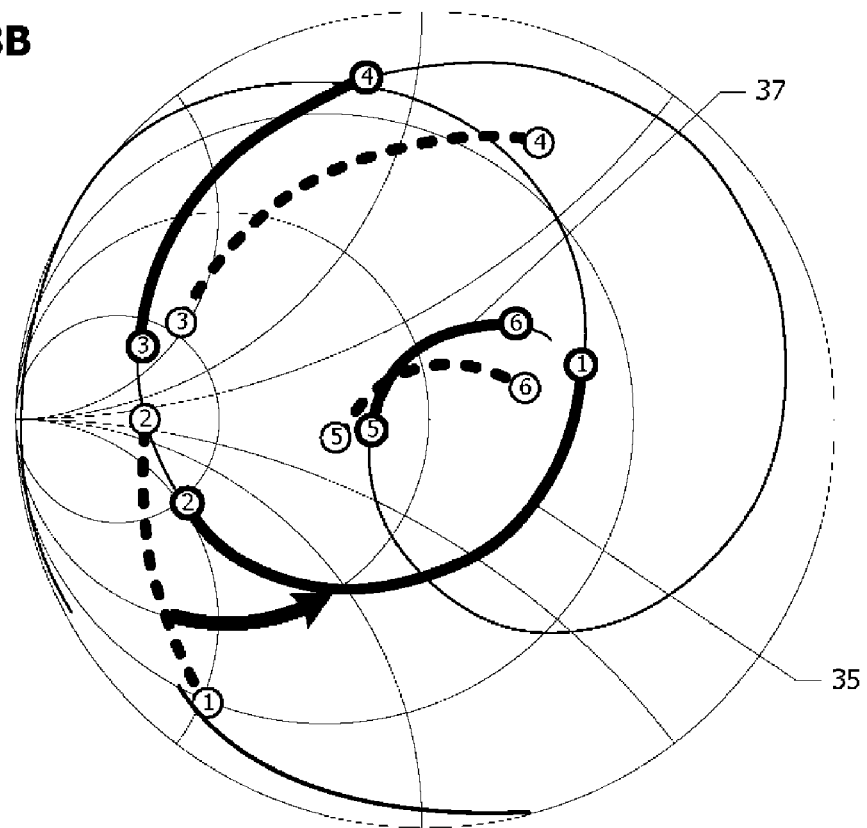
FIG. 18B is the corresponding admittance chart.

FIGS. 18A and 18B show a result of simulation of return loss and a locus of input impedance on an admittance chart, respectively, obtained when the first resonant circuit 51 is shunt-connected to the feeding point 38 by the switch 53 as illustrated in FIG. 17. The first resonant circuit 51 exhibits an inductive impedance in the first low frequency band 35.

As shown in FIG. 18B, a point representing input impedance in the first low frequency band 35 approaches the center of the admittance chart, that is, about 50Ω, for example. Since impedance matching is improved in the first low frequency band 35, a return loss is lowered in the first low frequency band 35 as shown in FIG. 18A. Since the first resonant circuit 51 exhibits a high impedance in the high frequency band 37, the impedance matching conditions are affected very little. Therefore, the impedance-matched state is maintained in the high frequency band 37.

A state where the second resonant circuit 52 (FIG. 17) is shunt-connected to the feeding point 38 by the switch 53 is the same as that illustrated in FIG. 14 of the present preferred embodiment. Therefore, as shown in FIGS. 15A and 15B, impedance matching is improved and a return loss is lowered in the second low frequency band 36.

Fourth Preferred Embodiment

FIG. 19 is an equivalent circuit diagram of an antenna device according to a fourth preferred embodiment of the present invention. In the fourth preferred embodiment, the variable resonant circuit 50 is defined by a series resonant circuit including a fixed inductor and a variable capacitor. By varying the capacitance of the variable capacitor, the resonance characteristic of the variable resonant circuit is able to be switched between the first resonance characteristic and the second resonance characteristic.

The inductance of the fixed inductor is, for example, about 18 nH. When the capacitance of the variable capacitor is adjusted to about 3.8 pF, the same state as that in which the first resonant circuit 51 (FIG. 17) of the third preferred embodiment is shunt-connected to the feeding point 38 is realized. When the capacitance of the variable capacitor is adjusted to about 0.8 pF, the same state as that in which the second resonant circuit 52 (FIG. 17) of the third preferred embodiment is shunt-connected to the feeding point 38 is realized.

The antenna device of the fourth preferred embodiment further includes a sensor 75 and a control circuit 76. The sensor 75 detects the approach of an object, such as a human body or a conductive body, which affects the radiation characteristics of the radiating element 30. The result of the detection by the sensor 75 is provided to the control circuit 76. In accordance with the result of the detection by the sensor 75, the control circuit 76 varies the capacitance of the variable capacitor. This makes it possible to compensate for the loss of the impedance matching state caused by the approach of a human body or a conductive body, and to maintain the matching state.

Fifth Preferred Embodiment

Figure 20:
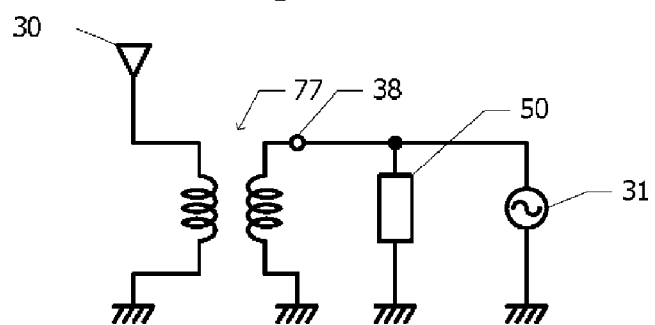
FIG. 20 is an equivalent circuit diagram of an antenna device according to a fifth preferred embodiment of the present invention.

FIG. 20 is an equivalent circuit diagram of an antenna device according to a fifth preferred embodiment of the present invention. In the antenna device of the fifth preferred embodiment, a matching transformer 77 is inserted between the feeding point 38 and the radiating element 30. Other configurations are the same as those of the antenna device of the first preferred embodiment illustrated in FIG. 6A. Before description of the operation and effect of the antenna device of the fifth preferred embodiment, antenna devices according to reference examples will be described with reference to FIGS. 21A to 23C.

Figure 21A:
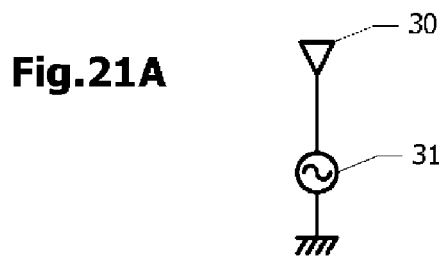
FIG. 21A is an equivalent circuit diagram of an antenna device according to a reference example.
Figure 21B:
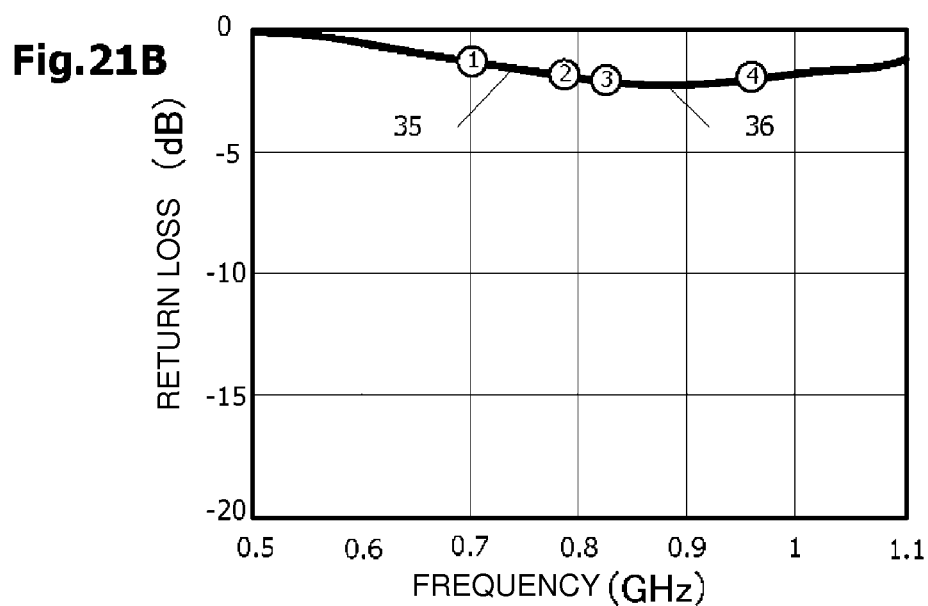
FIG. 21B is a graph showing a result of simulation of frequency characteristics of return loss of the antenna device illustrated in FIG. 21A.
Figure 21C:
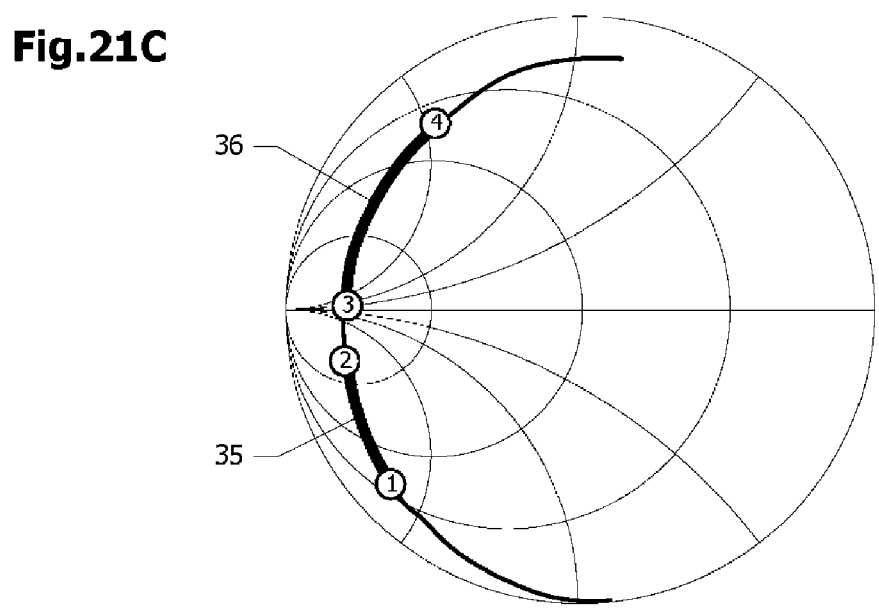
FIG. 21C is the corresponding admittance chart.

FIG. 21A is an equivalent circuit diagram of an antenna device having no matching circuit inserted therein. High frequency power is supplied from the feeding circuit 31 to the radiating element 30. FIGS. 21B and 21C show a result of simulation of frequency characteristics of return loss and a locus of input impedance on an admittance chart, respectively, of the radiating element 30 illustrated in FIG. 21A. Since no matching circuit is inserted, impedance matching is not achieved in the first low frequency band 35 and the second low frequency band 36. That is, a return loss is high as shown in FIG. 21B, and each point representing the input impedance is located in a region distant from the center of the admittance chart. Although not shown in FIGS. 21B and 21C, impedance matching is achieved in the high frequency band 37 (see, e.g., FIG. 11A).

Figure 22A:
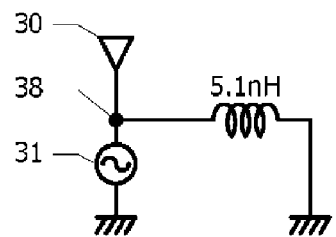
FIG. 22A is an equivalent circuit diagram of an antenna device according to another reference example.
Figure 22B:
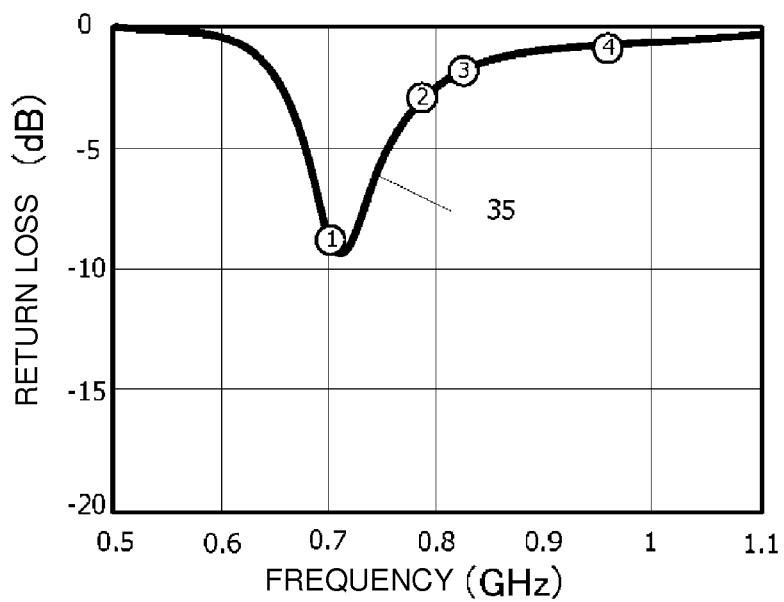
FIG. 22B is a graph showing a result of simulation of frequency characteristics of return loss of the antenna device illustrated in FIG. 22A.
Figure 22C:
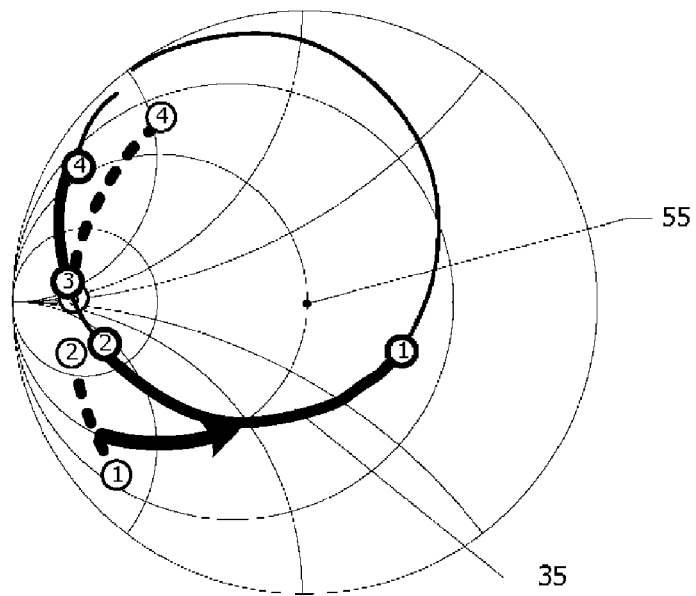
FIG. 22C is the corresponding admittance chart.

FIGS. 22B and 22C show a result of simulation of return loss and a locus of input impedance on an admittance chart, respectively, obtained when an approximately 5.1 nH shunt inductor is inserted as illustrated in FIG. 22A. The insertion of the approximately 5.1 nH shunt inductor improves impedance matching in the first low frequency band 35. However, as shown, a return loss in the vicinity of about 784 MHz, which is the upper limit frequency of the first low frequency band 35, is higher than that in the vicinity of about 704 MHz, which is the lower limit frequency of the first low frequency band 35. That is, a sufficiently low return loss is not achieved over the entire range of the first low frequency band 35.

When the shunt inductor is inserted, point 2 corresponding to the upper limit frequency moves in the direction of decreasing susceptance along the constant conductance circle 32 as shown in FIG. 22C. Under the conditions shown in FIG. 22C, even when point 2 is moved in the direction of decreasing susceptance along the constant conductance circle 32, point 2 cannot be brought sufficiently close to the center 55 of the admittance chart. That is, in the vicinity of the upper limit frequency of the first low frequency band 35, it is difficult to improve impedance matching only by the shunt inductor.

Figure 23A:
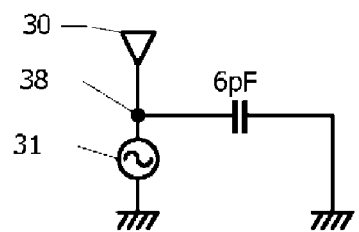
FIG. 23A is an equivalent circuit diagram of an antenna device according to another reference example.
Figure 23B:
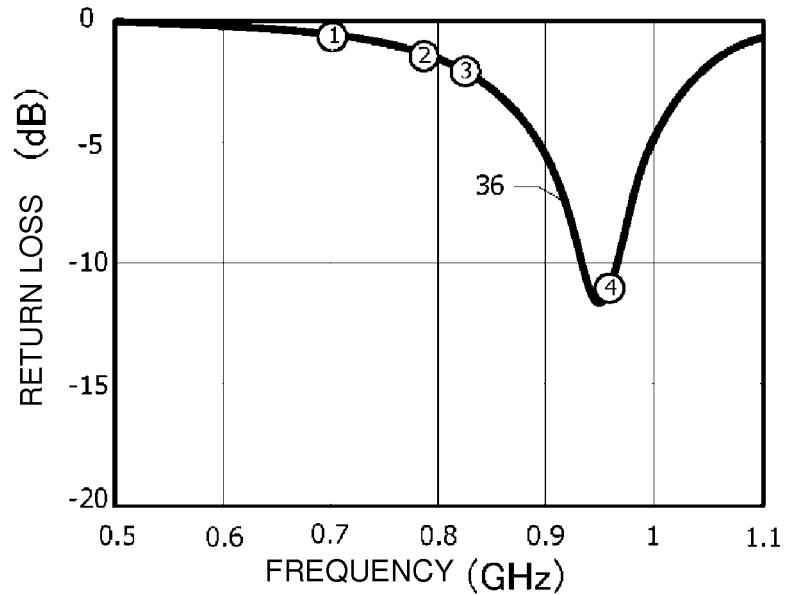
FIG. 23B is a graph showing a result of simulation of frequency characteristics of return loss of the antenna device illustrated in FIG. 23A.
Figure 23C:
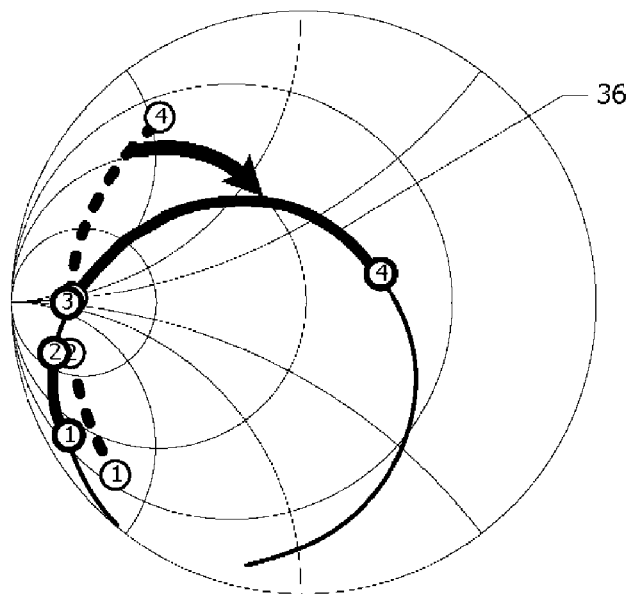
FIG. 23C is the corresponding admittance chart.

FIGS. 23B and 23C show a result of simulation of return loss and a locus of input impedance on an admittance chart, respectively, obtained when an approximately 6 pF shunt capacitor is inserted as illustrated in FIG. 23A. The insertion of the approximately 6 pF shunt capacitor improves impedance matching in the second low frequency band 36. However, a return loss in the vicinity of about 824 MHz, which is the lower limit frequency of the second low frequency band 36, is higher than that in the vicinity of about 960 MHz, which is the higher limit frequency of the second low frequency band 36. That is, a sufficiently low return loss is not achieved over the entire range of the second low frequency band 36.

When the shunt capacitor is inserted, point 3 corresponding to the lower limit frequency moves in the direction of increasing susceptance along the constant conductance circle 32 as shown in FIG. 23C. Under the conditions shown in FIG. 23C, even when point 3 is moved in the direction of increasing susceptance along the constant conductance circle 32, point 3 cannot be brought sufficiently close to the center 55 of the admittance chart. That is, in the vicinity of the lower limit frequency of the second low frequency band 36, it is difficult to improve impedance matching only by the shunt inductor.

In the antenna device of the fifth preferred embodiment described below, it is possible to sufficiently improve impedance matching even in the vicinity of the upper limit frequency of the first low frequency band 35 and the vicinity of the lower limit frequency of the second low frequency band 36 where it is difficult to improve impedance matching only by the shunt inductor or the shunt capacitor. The operation and effect of the antenna device of the fifth preferred embodiment will be described with reference to FIGS. 24A to 26C.

Figure 24A:
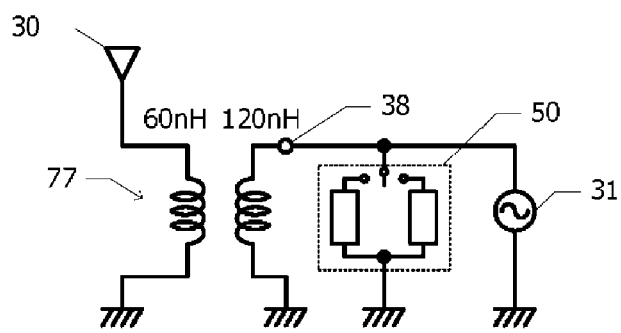
FIG. 24A is an equivalent circuit diagram of an antenna device according to a fifth preferred embodiment of the present invention in which the variable resonant circuit is not shunt-connected.
Figure 24B:
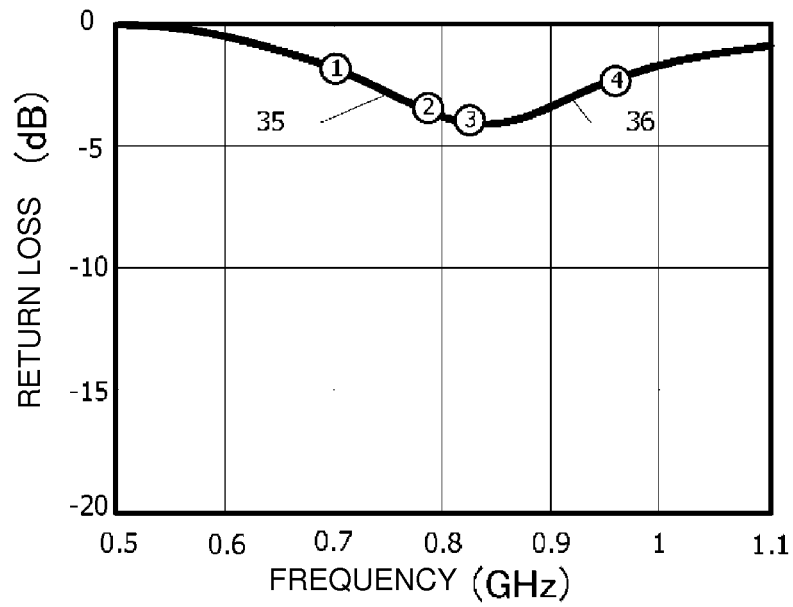
FIG. 24B is a graph showing a result of simulation of frequency characteristics of return loss of the antenna device illustrated in FIG. 24A.
Figure 24C:
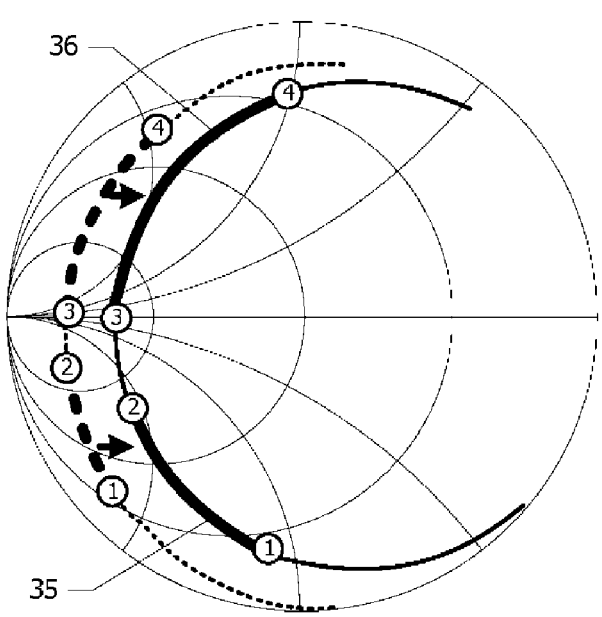
FIG. 24C is the corresponding admittance chart.

FIGS. 24B and 24C show a result of simulation of return loss and a locus of input impedance on an admittance chart, respectively, obtained when the variable resonant circuit 50 is not inserted between the feeding point 38 and the ground as illustrated in FIG. 24A. A broken line shown in FIG. 24C indicates the locus of input impedance as viewed from the feeding point 38 toward the radiating element 30 when the variable resonant circuit 50 is not inserted between the feeding point 38 and the ground. Of two inductances of the matching transformer 77, the inductance connected to the radiating element 30 is approximately 60 nH and the inductance connected to the feeding point 38 is approximately 20 nH. That is, the transformer ratio preferably is 1:2. Since the variable resonant circuit 50 is not inserted, impedance matching is not achieved in the first low frequency band 35 and the second low frequency band 36.

When the matching transformer is inserted, the locus of input impedance as viewed from the feeding point 38 toward the radiating element 30 is moved rightward on the admittance chart as shown in FIG. 24C.

Figure 25A:
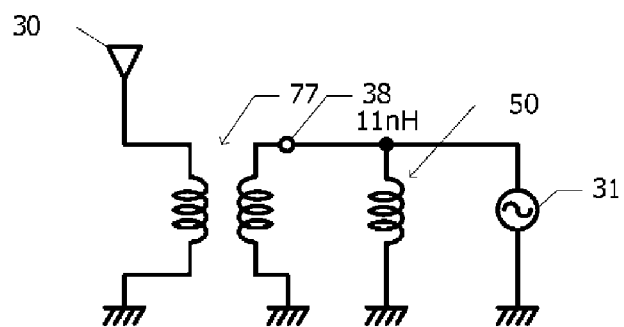
FIG. 25A is an equivalent circuit diagram of the antenna device according to the fifth preferred embodiment of the present invention in which the variable resonant circuit is an inductor.
Figure 25B:
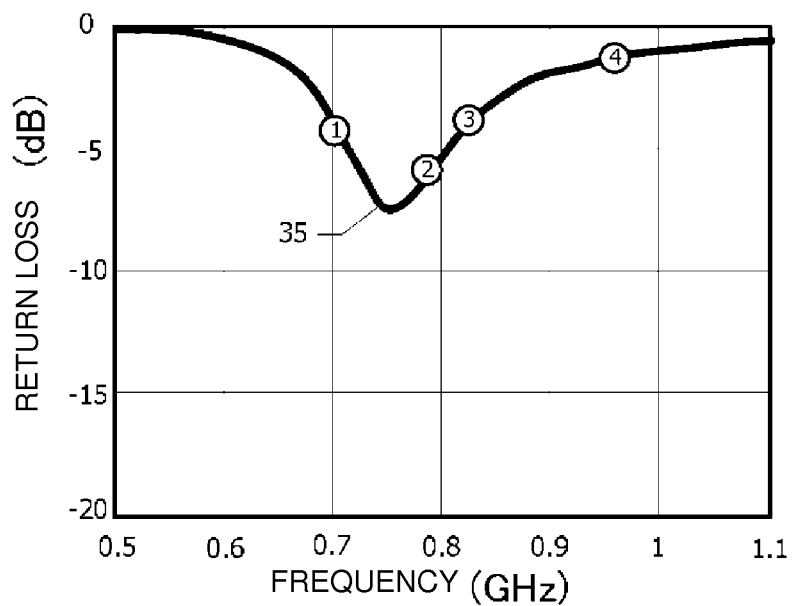
FIG. 25B is a graph showing a result of simulation of frequency characteristics of return loss of the antenna device illustrated in FIG. 25A.
Figure 25C:
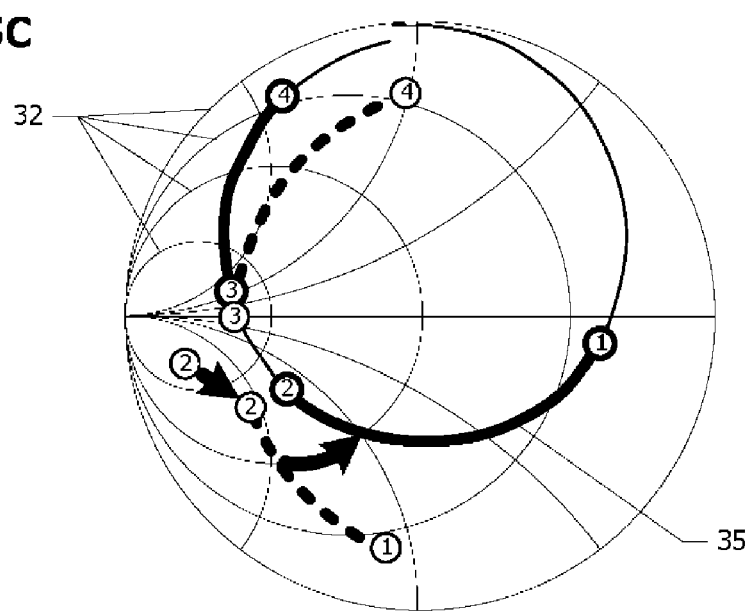
FIG. 25C is the corresponding admittance chart.

FIGS. 25B and 25C show a result of simulation of return loss and a locus of input impedance on an admittance chart, respectively, obtained when an 11 nH inductor (shunt inductor) is connected at the location of the variable resonant circuit 50 as illustrated in FIG. 25A. Impedance matching is improved in the first low frequency band 35.

Point 2 corresponding to the upper limit frequency of the first low frequency band 35 is moved rightward on the admittance chart by connecting the matching transformer, and is further moved in the direction of decreasing susceptance along the constant conductance circle 32 by connecting the shunt inductor. Therefore, the input impedance in the vicinity of the upper limit frequency of the first low frequency band 35 is able to be brought sufficiently close to about 50Ω.

A comparison between the return loss of the antenna device with no matching transformer connected therein (FIG. 22B) and the return loss of the antenna device with a matching transformer connected therein (FIG. 25B) shows that a low return loss is achieved in a balanced manner over the entire range of the first low frequency band 35.

Figure 26A:
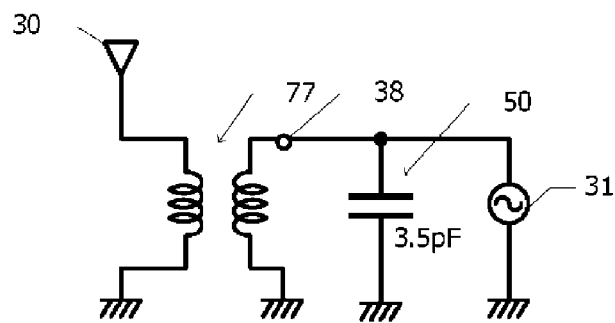
FIG. 26A is an equivalent circuit diagram of the antenna device according to the fifth preferred embodiment of the present invention in which the variable resonant circuit is an inductor.
Figure 26B:
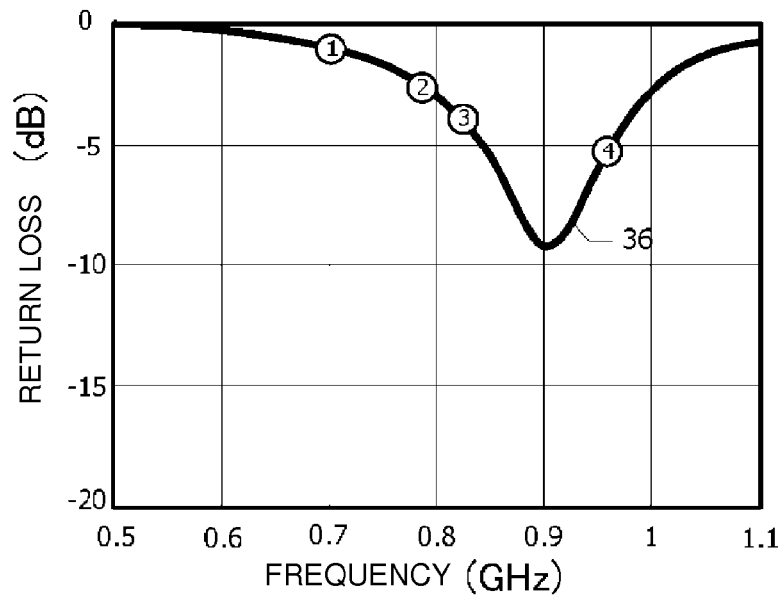
FIG. 26B is a graph showing a result of simulation of frequency characteristics of return loss of the antenna device illustrated in FIG. 26A.
Figure 26C:
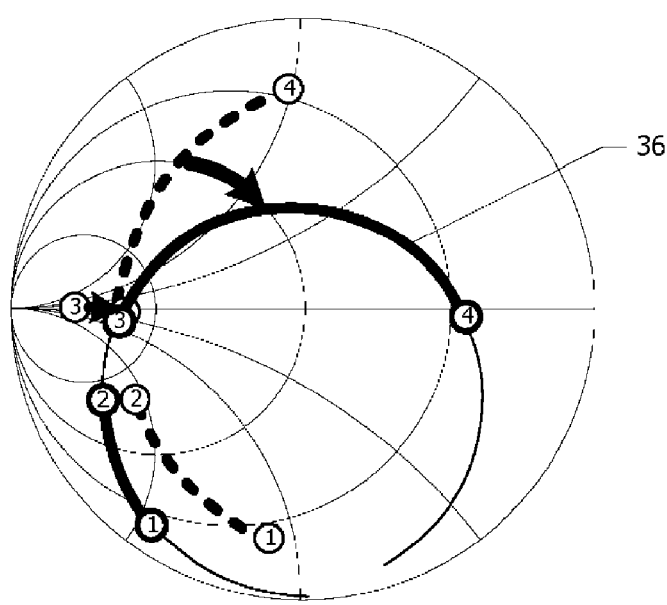
FIG. 26C is the corresponding admittance chart.

FIGS. 26B and 26C show a result of simulation of return loss and a locus of input impedance on an admittance chart, respectively, obtained when an approximately 3.5 pF capacitor (shunt capacitor) is connected at the location of the variable resonant circuit 50 as illustrated in FIG. 26A. Impedance matching is improved in the second low frequency band 36.

Point 3 corresponding to the lower limit frequency of the second low frequency band 36 is moved rightward on the admittance chart by connecting the matching transformer, and is moved farther in the direction of increasing susceptance along the constant conductance circle 32 by connecting the shunt capacitor. Therefore, the input impedance in the vicinity of the lower limit frequency of the second low frequency band 36 is able to be brought sufficiently close to about 50Ω.

A comparison between the return loss of the antenna device with no matching transformer connected therein (FIG. 23B) and the return loss of the antenna device with a matching transformer connected therein (FIG. 26B) shows that a low return loss is achieved in a balanced manner over the entire range of the second low frequency band 36.

Although the present invention has been described in accordance with various preferred embodiments, the present invention is not limited to them. For example, it should be clear to those skilled in the art that various changes, improvements, and combinations are possible.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
a radiating element that operates in a first low frequency band, a second low frequency band higher than the first low frequency band, and a high frequency band higher than the second low frequency band;
a ground conductor; and
a variable resonant circuit inserted between a feeding point of the radiating element and the ground conductor, and that switches between at least two resonance characteristics, a first resonance characteristic and a second resonance characteristic; wherein
in an open state in which the variable resonant circuit is not inserted between the feeding point and the ground conductor, an input impedance of the radiating element is lower than about 50Ω and capacitive in the first low frequency band, lower than about 50Ω and inductive in the second low frequency band, and closer to about 50Ω in the high frequency band than the input impedances in the first low frequency band and the second low frequency band are;
when the variable resonant circuit exhibits the first resonance characteristic, the variable resonant circuit is inductive in the first low frequency band, and an impedance of the variable resonant circuit in the high frequency band is higher than an impedance of the variable resonant circuit in the first low frequency band; and
when the variable resonant circuit exhibits the second resonance characteristic, the variable resonant circuit is capacitive in the second low frequency band, and an impedance of the variable resonant circuit in the high frequency band is higher than an impedance of the variable resonant circuit in the second low frequency band.

2. The antenna device according to claim 1, wherein
in the first low frequency band, the input impedance of the radiating element obtained when the variable resonant circuit exhibits the first resonance characteristic is closer to about 50Ω than the input impedance of the radiating element obtained in the open state is; and
in the second low frequency band, the input impedance of the radiating element obtained when the variable resonant circuit exhibits the second resonance characteristic is closer to about 50Ω than the input impedance of the radiating element obtained in the open state is.

3. The antenna device according to claim 1, wherein when the feeding point and the ground conductor are in the open state, a return loss of the radiating element in the high frequency band is lower than return losses of the radiating element in the first low frequency band and the second low frequency band.

4. The antenna device according to claim 1, wherein the first low frequency band ranges from about 704 MHz to about 787 MHz, the second low frequency band ranges from about 824 MHz to about 960 MHz, and the high frequency band ranges from about 1710 MHz to about 2170 MHz.

5. The antenna device according to claim 1, wherein the variable resonant circuit includes:
a first resonant circuit exhibiting the first resonance characteristic;
a second resonant circuit exhibiting the second resonance characteristic; and
a switch that switches between a state in which the first resonant circuit is inserted between the feeding point of the radiating element and the ground conductor and a state in which the second resonant circuit is inserted between the feeding point of the radiating element and the ground conductor; and
one of the first resonant circuit and the second resonant circuit is defined by an LC series resonant circuit, and the other of the first resonant circuit and the second resonant circuit is defined by an LC series resonant circuit or an LC parallel resonant circuit.

6. The antenna device according to claim 1, wherein the variable resonant circuit includes an inductor and a variable capacitor connected in series to each other, and switches between the first resonance characteristic and the second resonance characteristic by varying a capacitance of the variable capacitor.

7. The antenna device according to claim 6, further comprising:
a sensor that detects an approach of an object that affects radiation characteristics of the radiating element; and
a control circuit that varies the capacitance of the variable capacitor in accordance with a result of detection by the sensor.

8. The antenna device according to claim 1, further comprising a matching transformer inserted between the radiating element and the feeding point.

9. The antenna device according to claim 1, wherein the radiating element is located adjacent to an edge of the ground conductor.

10. The antenna device according to claim 1, wherein the ground conductor includes a dielectric substrate and conductive films provided on opposite surfaces of the dielectric substrate.

11. The antenna device according to claim 1, wherein the radiating element includes a high-frequency radiating element and a low-frequency radiating element.

12. The antenna device according to claim 1, wherein the radiating element is one of a branch monopole antenna and an antenna including a parasitic element including a single resonance in the low frequency band and a double resonance in the high frequency band.

13. The antenna device according to claim 1, wherein the variable resonant circuit is shunt-connected between the feeding point of the radiating element and the ground conductor.

14. The antenna device according to claim 1, wherein the variable resonant circuit includes:
a first resonant circuit exhibiting the first resonance characteristic;
a second resonant circuit exhibiting the second resonance characteristic; and
a switch that switches between a state in which the first resonant circuit is inserted between the feeding point of the radiating element and the ground conductor and a state in which the second resonant circuit is inserted between the feeding point of the radiating element and the ground conductor; and
one of the first resonant circuit and the second resonant circuit is defined by an LC parallel resonant circuit, and the other of the first resonant circuit and the second resonant circuit is defined by an LC series resonant circuit.

15. The antenna device according to claim 1, wherein a shunt capacitor is inserted at the feeding point.

16. The antenna device according to claim 1, wherein the variable resonant circuit includes:
a first resonant circuit exhibiting the first resonance characteristic;
a second resonant circuit exhibiting the second resonance characteristic; and
a switch that switches between a state in which the first resonant circuit is inserted between the feeding point of the radiating element and the ground conductor and a state in which the second resonant circuit is inserted between the feeding point of the radiating element and the ground conductor; and
each of the first resonant circuit and the second resonant circuit is defined by an LC series resonant circuit.

17. The antenna device according to claim 1, wherein the series resonant circuit is defined by a fixed inductor and a variable capacitor.

18. The antenna device according to claim 1, wherein a shunt capacitor is inserted at the feeding point.

19. A radio terminal comprising the antenna device according to claim 1.

* * * * *